United States Patent [19]

Grzeszykowski

[11] Patent Number: 4,752,748
[45] Date of Patent: Jun. 21, 1988

[54] INTELLIGENT PHASE-LOCKED LOOP

[75] Inventor: Miroslaw Grzeszykowski, Mississauga, Canada

[73] Assignee: Amdahl Corporation, Sunnyvale, Calif.

[21] Appl. No.: 39,656

[22] Filed: Apr. 16, 1987

[51] Int. Cl.$^4$ ............................................. H03L 7/10
[52] U.S. Cl. ..................................... 331/1 A; 331/17; 331/25; 331/DIG. 2
[58] Field of Search ................. 331/1 A, 17, 18, 25, 331/DIG. 2; 375/120

[56] References Cited

U.S. PATENT DOCUMENTS 4,513,429 4/1985 Roeder ............................. 375/77 X Primary Examiner—Eugene R. Laroche
Assistant Examiner—David Mis
Attorney, Agent, or Firm—Fliesler, Dubb, Meyer & Lovejoy

[57] ABSTRACT

An intelligent phase-locked loop performs adaptive transfer function parameter selection and fault tolerant self-monitoring within the phase error filtering algorithm. The algorithm includes a capture mode, at least one align mode and an operate mode. The capture mode shifts to the align mode if the phase error limit is not exceeded at the end of a first period of time. The align mode switches back to the capture mode if a reverse phase error relation is met during the mode. At the end of the align mode, the algorithm switches to the operate mode if a forward phase error relation is met. The operate mode continues indefinitely. However, a switchback to the align mode is made if an out of lock phase error limit is exceeded for the operate mode. The bandwidths of the transfer function of the loop are adapted for each of the modes so that the capture mode is the broadest bandwidth, the align mode is an intermediate bandwidth and the operate mode is a narrow bandwidth. Further, according to the invention, the algorithm performs hardware fault monitoring based on statistical processing carried out during the phase error filtering cycle.

17 Claims, 16 Drawing Sheets

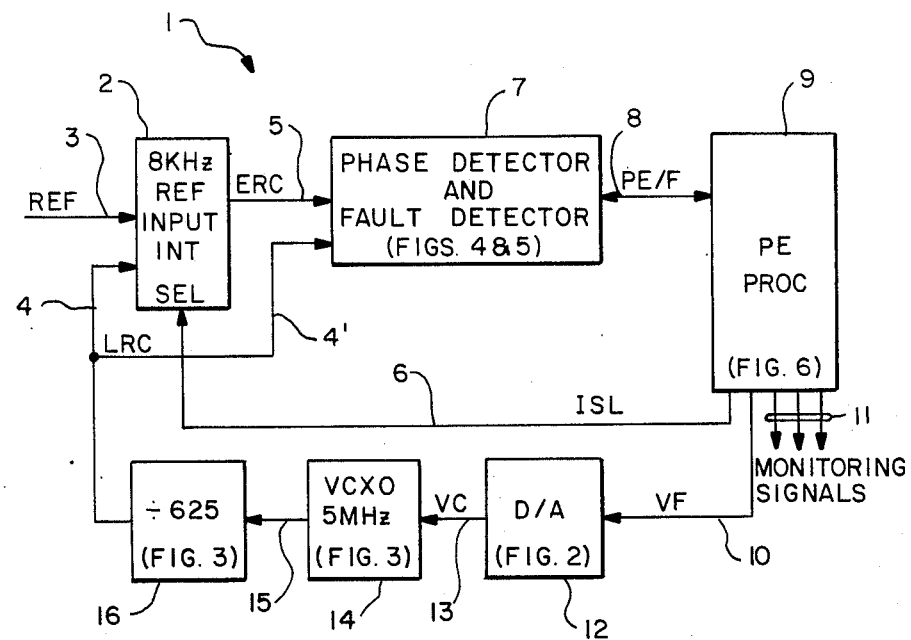
FIG.—1
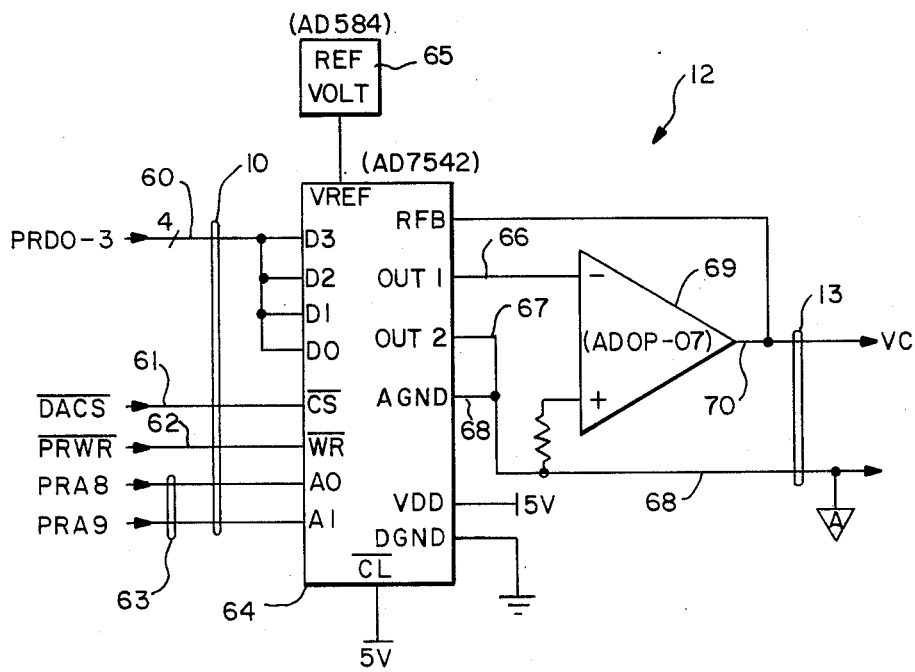
FIG.—2

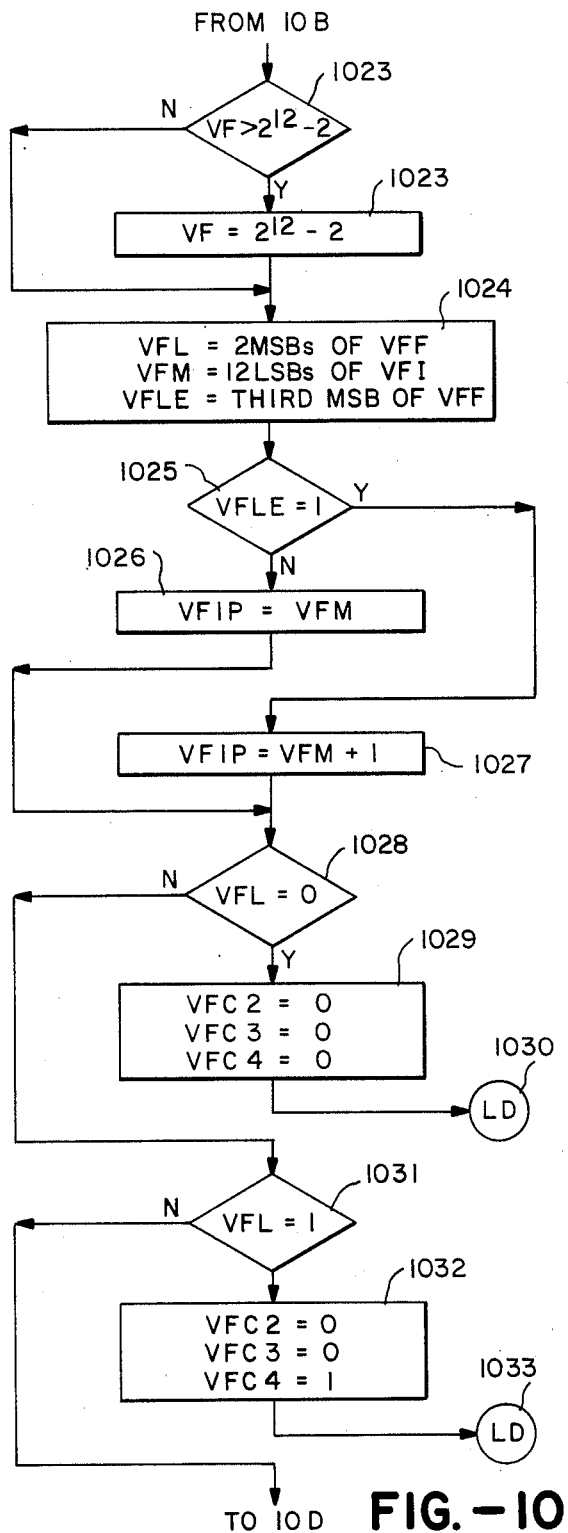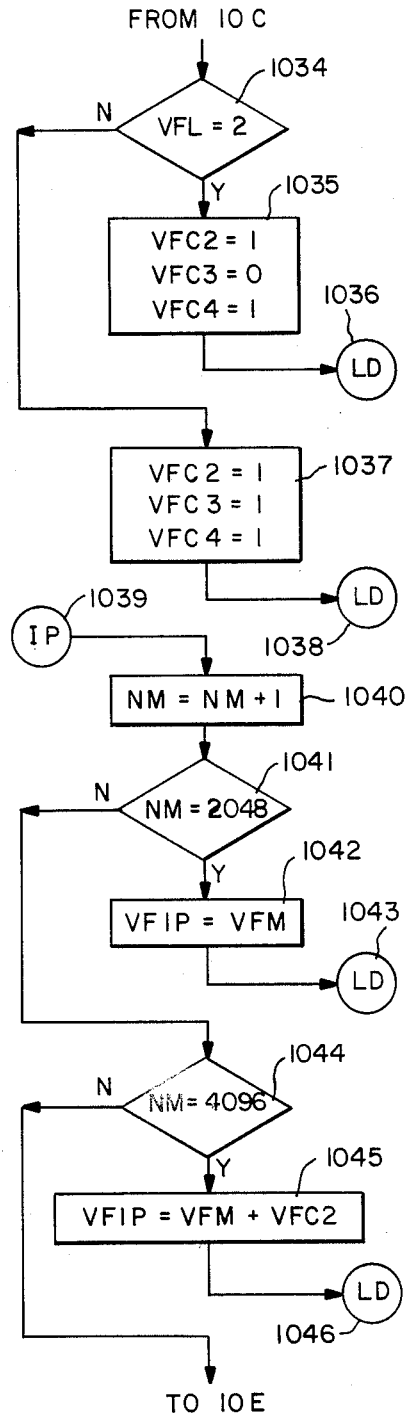
FIG.—10C   FIG—10D

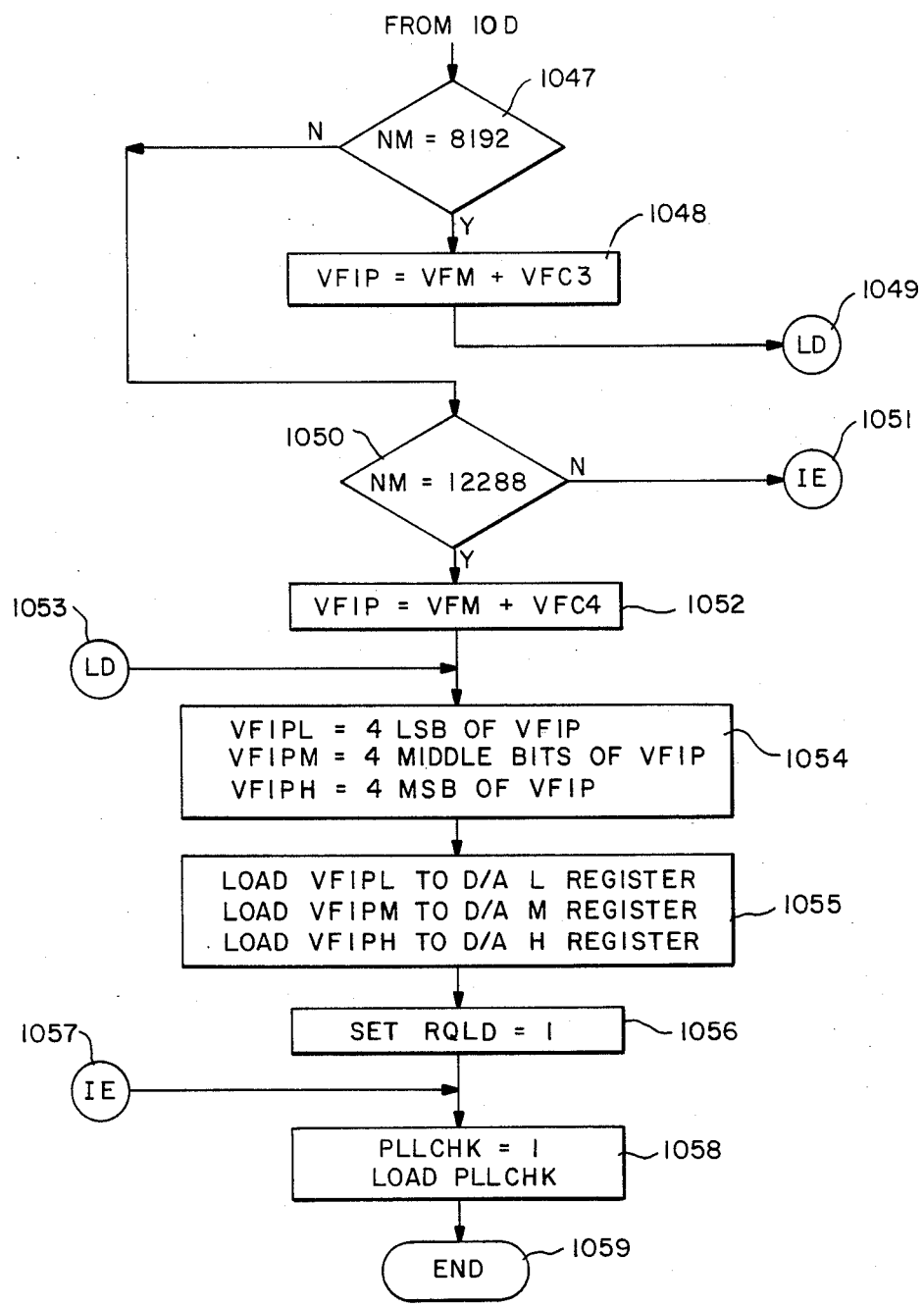
FIG.—10E

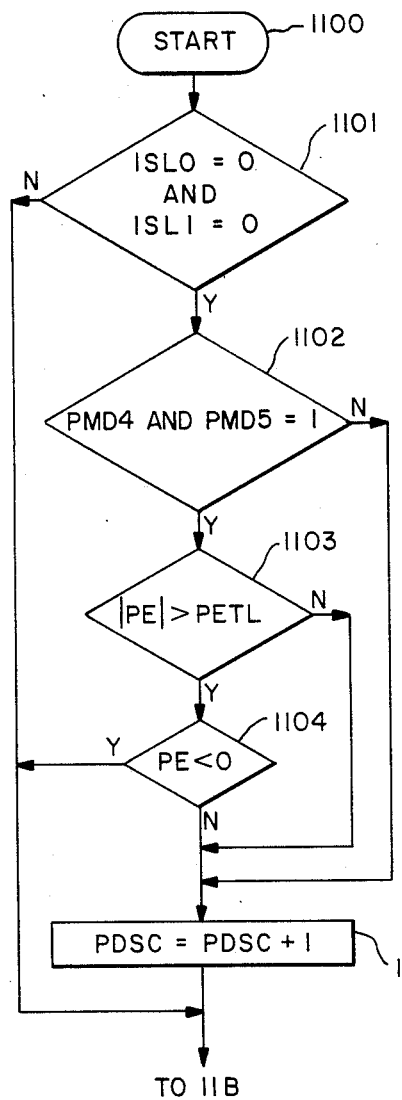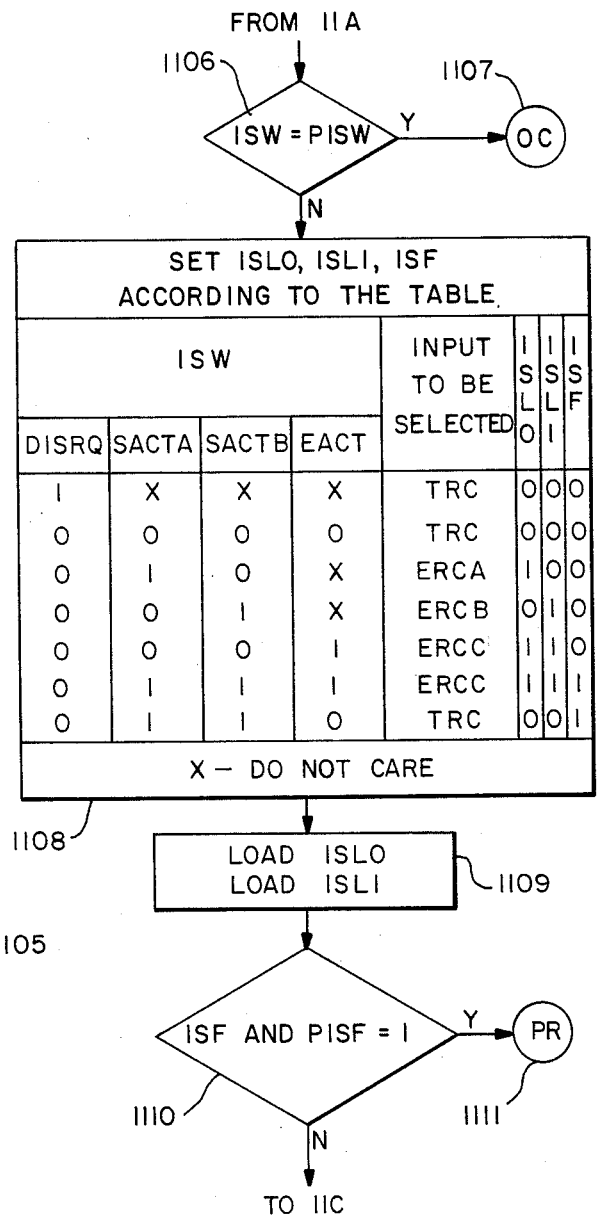
FIG.—11A
FIG.—11B

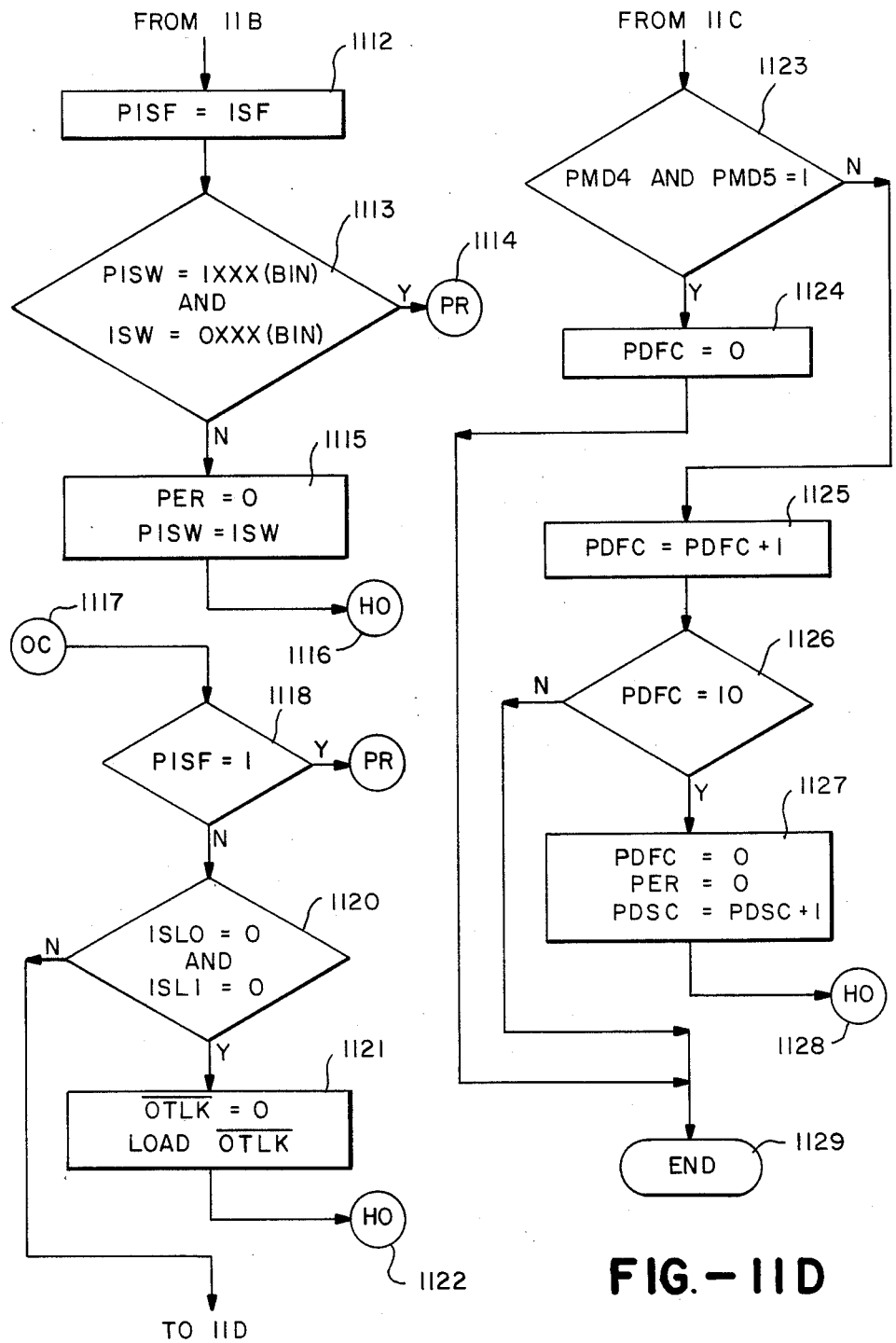
FIG.—11C
FIG.—11D

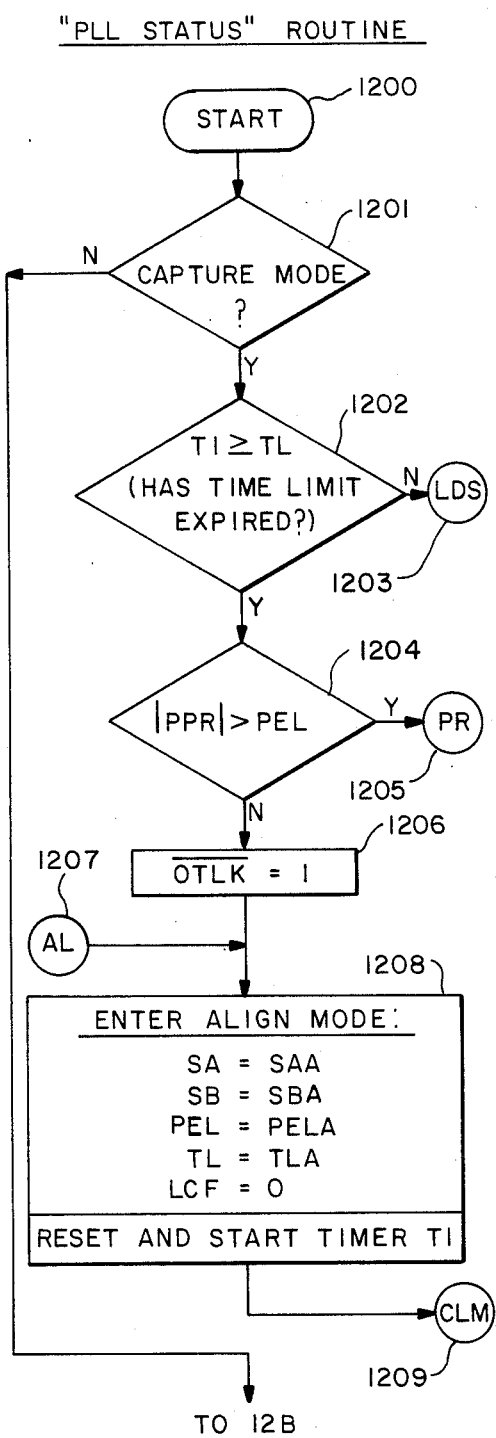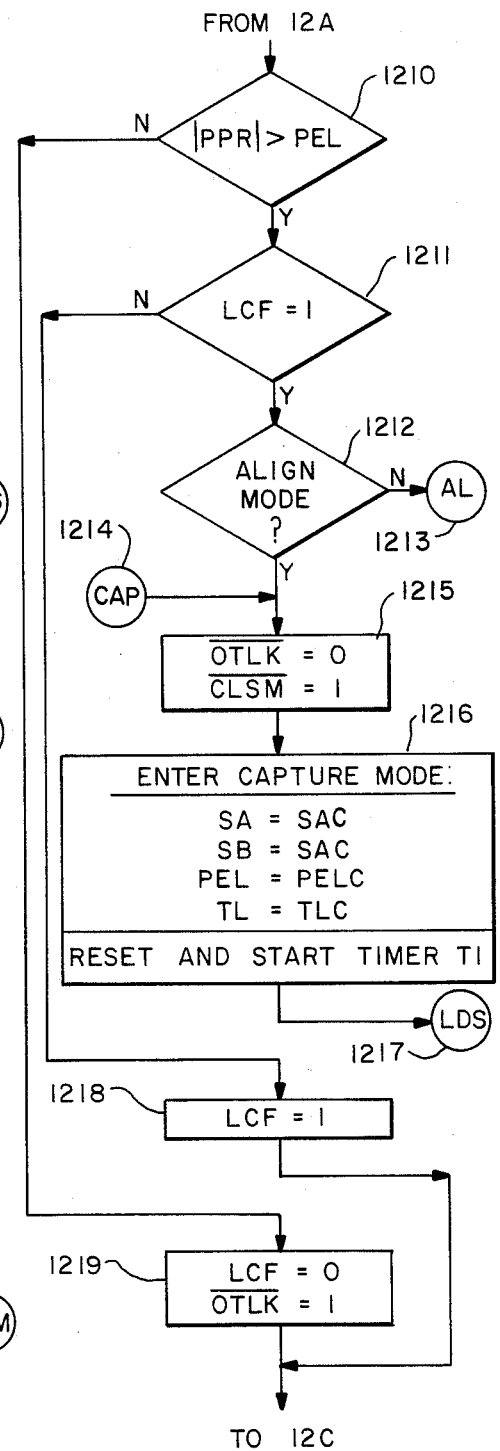
FIG.—12A  FIG.—12B

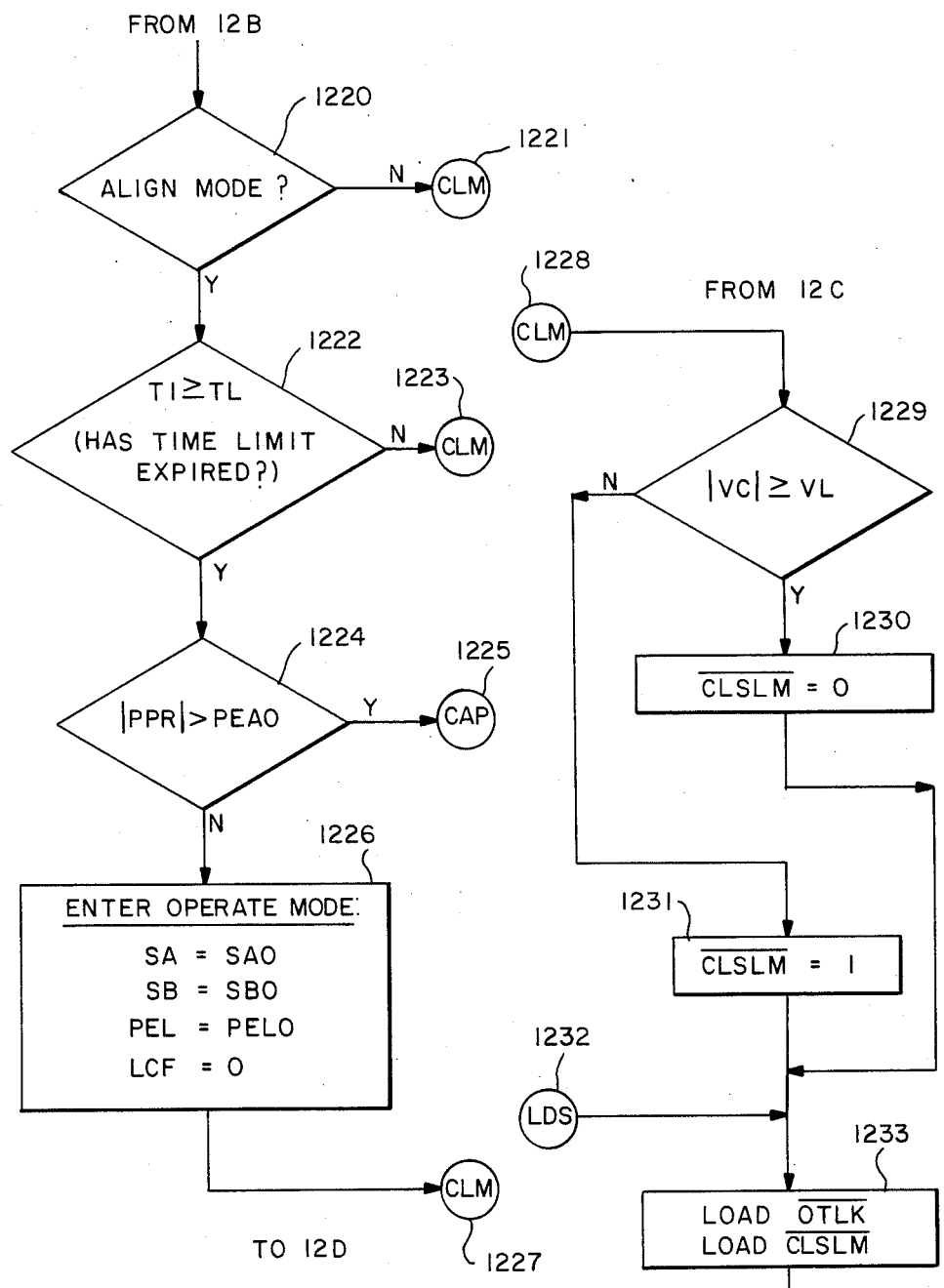
FIG.—12C
FIG.—12D

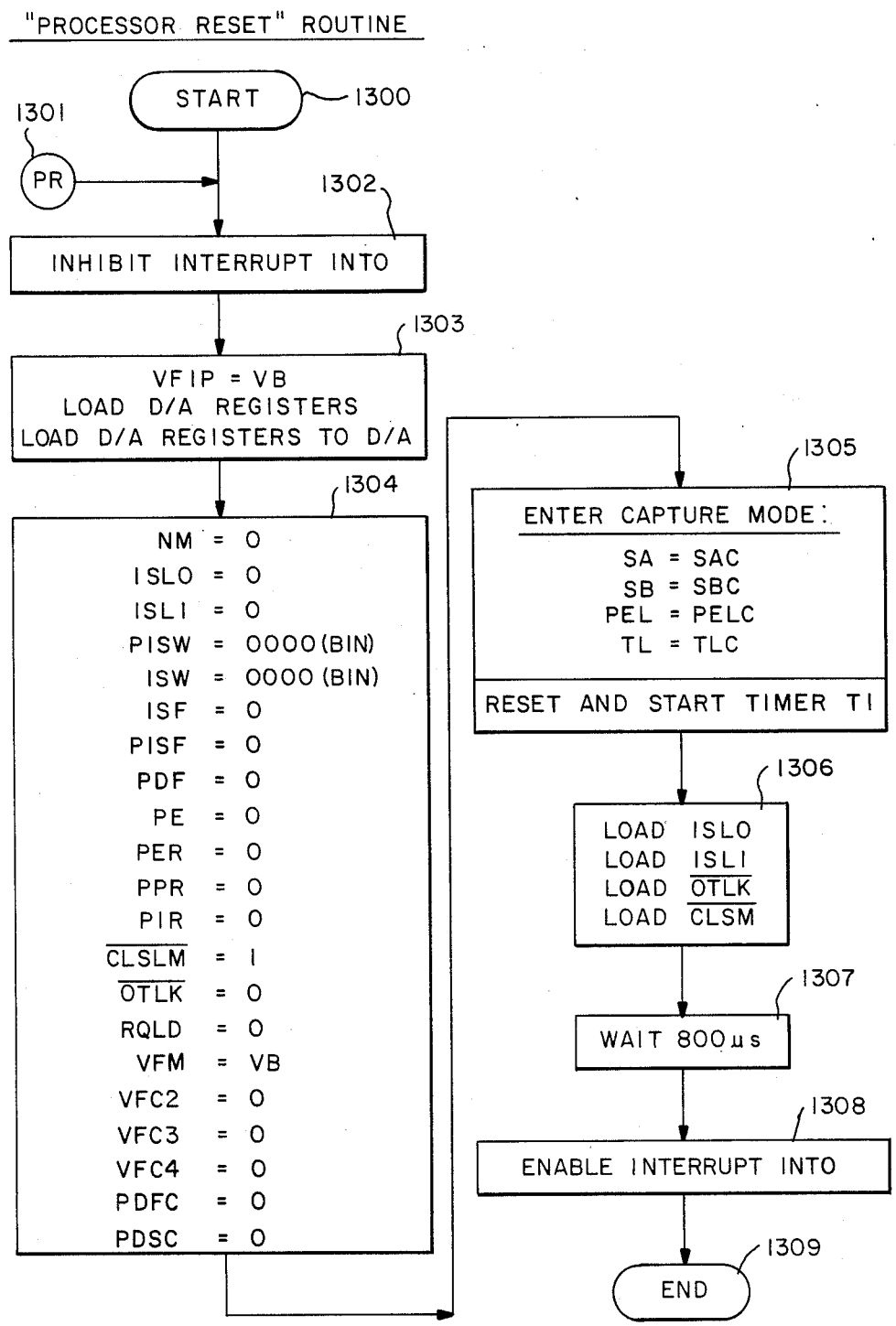
FIG.—13

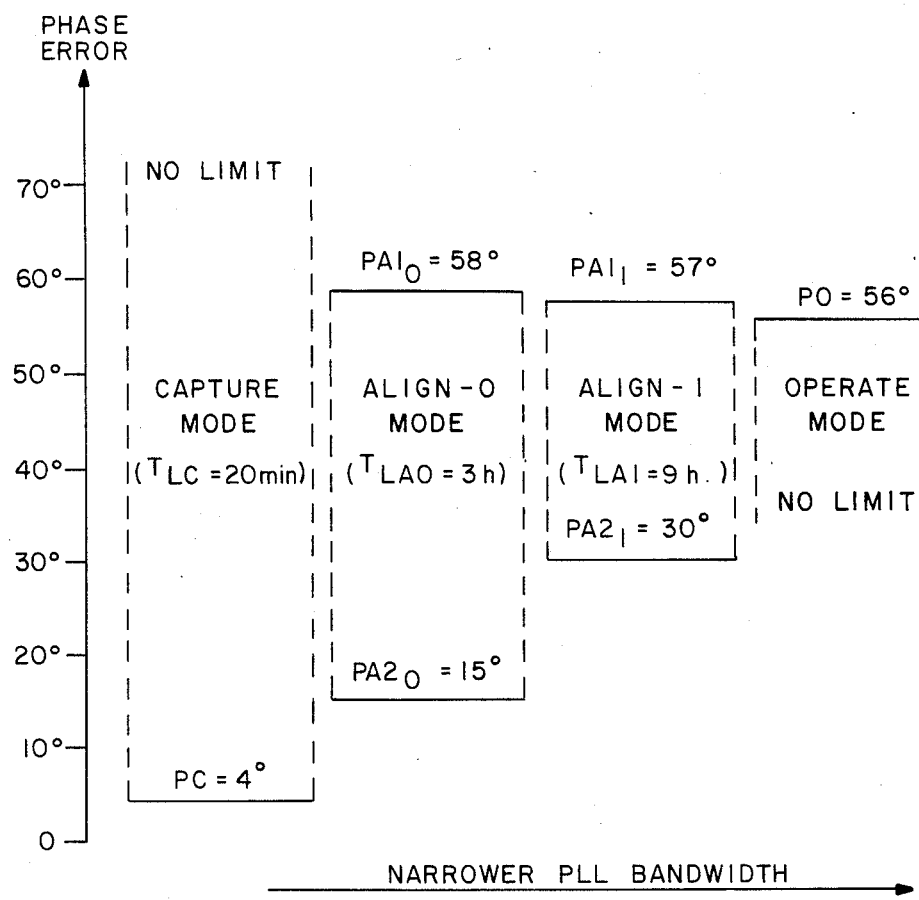
EXAMPLE OF PHASE ERROR AND TIME LIMITS FOR
ADAPTIVE PLL WITH TWO ALIGN MODES
FIG. — 14

INTELLIGENT PHASE-LOCKED LOOP

BACKGROUND OF THE INVENTION

1. Field of the Invention

The present invention relates to high-stability analog phase-locked loops with a digital processor employed for signal processing and control functions.

2. Description of Related Art

A phase-locked loop is designed to generate and maintain an internal reference signal in phase and frequency alignment with an external reference signal. Alignment is maintained by comparing the external reference signal to the internal reference signal to generate a phase error signal. The phase error signal is filtered to generate a control signal for adjusting the internal reference signal to minimize the phase error. In an environment which requires very accurate alignment, a phase-locked loop must have a filter with an extremely narrow bandwidth. A narrow bandwidth for the phase-locked loop results in a very narrow phase and frequency pull-in range. Thus, during start up or other times when the phase error is large, the phase-locked loop will be slow, or unable to adjust.

In previously known implementations of phase-locked loops, a wider pull-in range during start up is achieved either by initial manual frequency alignment or by use of a "pull-in" mode in which the parameters of the phase-locked loop are modified to provide a wider bandwidth. After initial lock-up in the pull-in mode, the phase-locked loop parameters are switched either manually or automatically to the narrow bandwidth required for high accuracy during operation.

The manual alignment method is inconvenient and expensive because it requires operator intervention in order to acquire a lock. The second method involving the automatic pull-in and operate modes, allows for automatic lock-up but requires a relatively long period of time in which to achieve full accuracy, both in the case of lock-up during startup of the phase-lock loop and in the case of recovery from a temporary loss of the external reference signal.

The long period of time required for lock-up is due to the wide gap between the bandwidth required for the pull-in mode and that required for high accuracy during the operation mode. Because of this wide gap, the alignment error at the end of the pull-in mode can be relatively large, requiring a relatively long time in the operate mode to achieve fine alignment.

Further, prior phase-locked loop systems are monitored for faults by an apparatus external to the signal processing algorithm of the phase-locked loop. When a fault condition defined by the occurrence of an error greater than a certain threshold is detected, the phase-locked loop is placed out of service. Thus, the occurrence of noise or other interference in the external reference signal or system hardware can affect system accuracy when it does not exceed the fault threshold, or result in unnecessary interruption when the threshold is exceeded.

Accordingly, the prior art is characterized by the inability to achieve a very accurate phase and frequency alignment fully automatically and quickly. Further, the prior art has failed to implement a high precision fault condition detection in the phase-locked loop environment.

The preferred embodiment of the present invention is implemented for use in synchronization of a digital transmission network or other environments requiring high accuracy phase-locked loop systems. An example of a network synchronization system to which the present invention is adapted, can be found in B. R. Saltzberg, and H. M. Zydney, "Digital Data System: Network Synchronization," THE BELL SYSTEM TECHNICAL JOURNAL, Vol. 54, No. 5, May–June 1975, pp. 879–792.

Background concerning phase-locked loops using digital data processors for signal processing and control functions in the network synchronization environment can be found in H. Fukinuki and I. Furukawa, "Intelligent PLL Using Digital Processing For Network Synchronization," IEEE TRANSACTIONS ON COMMUNICATIONS, Vol. COM-31, No. 12, December 1983. This article describes a digital processor controlled phase-locked loop typifying the prior art with a "pull-in" mode and an operating mode.

Examples of adaptive phase-locked loops are also provided in U.S. Pat. No. 4,513,429 by Roeder and U.S. Pat. No. 4,516,083 by Turney. The Roeder patent describes a system used for adaptive Doppler trackers. The Roeder patent provides a three-level adaptive phase-locked loop used for locking onto repetitive complex pulses. The three-level adaptive filter aids in the speed of lock and in the stability of the phase-locked loop. However, further improvements are desirable. The Turney patent describes an analog two-level phase-locked loop.

SUMMARY OF THE INVENTION

The present invention provides a phase-locked loop apparatus that achieves fast lock and high stability suitable for use in a network synchronization environment. Further, improvement in fault tolerance over the prior systems is achieved. Accordingly, in one aspect, the present invention is a phase-locked loop apparatus having a phase detector receiving an external reference signal and a loop reference signal and generating phase error signals. A phase error processor receives the phase error signals and generates a frequency control signal according to a transfer function having modes 1 to m, where m is at least 3, and where mode M, for M equal to 1, is adapted for quick alignment of the loop reference signal with the external reference signal, mode M for M between 1 and m, is adapted for stabilization of the loop reference signal, and mode M for M equal to m, is adapted for normal operation of the phase locked loop. A variable frequency oscillator responsive to the control signal generates the loop reference signal. A means is provided by the phase error processor for establishing hysteresis in the adaptable transfer function of the phase-locked loop.

In another aspect, the phase error processor, provides a means for monitoring the performance of the phase-locked loop to detect fault conditions and for responding to detected fault conditions.

According to the present invention, a method for processing the phase error signals to generate the frequency control signal in the phase error processor provides for adaptive parameter selection for the transfer function. The transfer function is adapted according to a capture mode, at least one align mode and an operate mode. During the capture mode, the mode transfer function parameters are set to capture mode time limit, an end-of-capture mode phase error limit and a wide bandwidth to establish a broad pull-in range. During the align mode, the bandwidth of the transfer function is made narrower than the capture mode or any preceding align mode and an end-of-align mode time limit is set. Further, an end-of-align mode phase error limit and an align mode out-of-lock limit are set for each align mode. During the operate mode, the transfer function parameters are set to provide a narrow bandwidth and an operate mode out-of-lock limit is set.

The inventive method for processing the phase error signals beginning in the capture mode, comprises the steps of:

(1) accumulating phase error signals for a preselected signal processing interval;

(2) generating the frequency control signal according to the transfer function over the phase error signals accumulated during the signal processing interval;

(3) if the current mode is an align or operate mode, testing the accumulated phase error signals against a loss-of-lock phase error limit for the current mode, and if the loss-of-lock phase error limit is exceeded, then shifting to a broader bandwidth mode; and (4) if the current mode is a capture mode, repeating steps 1 and 2 for the capture mode time limit, and then, proceeding to step 5, or if the current mode is an align mode, repeating steps 1, 2 and 3 for a mode time limit for the current mode, and then, proceeding to step 5, or if the current mode is an operate mode, repeating steps 1, 2, and 3;

(5) testing the accumulated phase error signals to determine whether an end-of-mode phase error limit for the current mode is exceeded, and if the end-of-mode phase error limit is not exceeded, then shifting to a narrower bandwidth mode.

In a further aspect of the present invention, the phase detector further generates fault signals upon the detection of irregularities in the received signals. The phase error processor receives the fault signals and performs fault tolerant self-monitoring according to the steps:

(1) accumulating fault signals generated during a current signal processing interval;

(2) performing statistical analysis of the accumulated fault signals during a signal processing interval; and (3) in response to the analysis of the accumulated fault signals, transferring the frequency control signal generated during the current signal processing interval or the frequency control signal generated during a previous signal processing interval to the variable frequency oscillator.

BRIEF DESCRIPTION OF THE DRAWINGS

FIG. 1 provides a block diagram of an intelligent phase-locked loop implementing the present invention.

FIG. 2 is a schematic diagram of a digital to analog converter for use in the system of FIG. 1.

FIGS. 10A through 10E illustrate the phase detector interrupt routine in the program of FIG. 9.

FIGS. 11A through 11D illustrate the phase-locked loop control algorithm in the program of FIG. 9.

FIGS. 12A through 12D illustrate the phase-locked loop status algorithm in the program of FIG. 9.

FIG. 13 illustrates the processor reset algorithm in the program of FIG. 9.

FIG. 14 is a chart used in illustrating the adaptive loop parameter algorithm of the present invention.

DESCRIPTION OF THE PREFERRED EMBODIMENT

Figure 3:
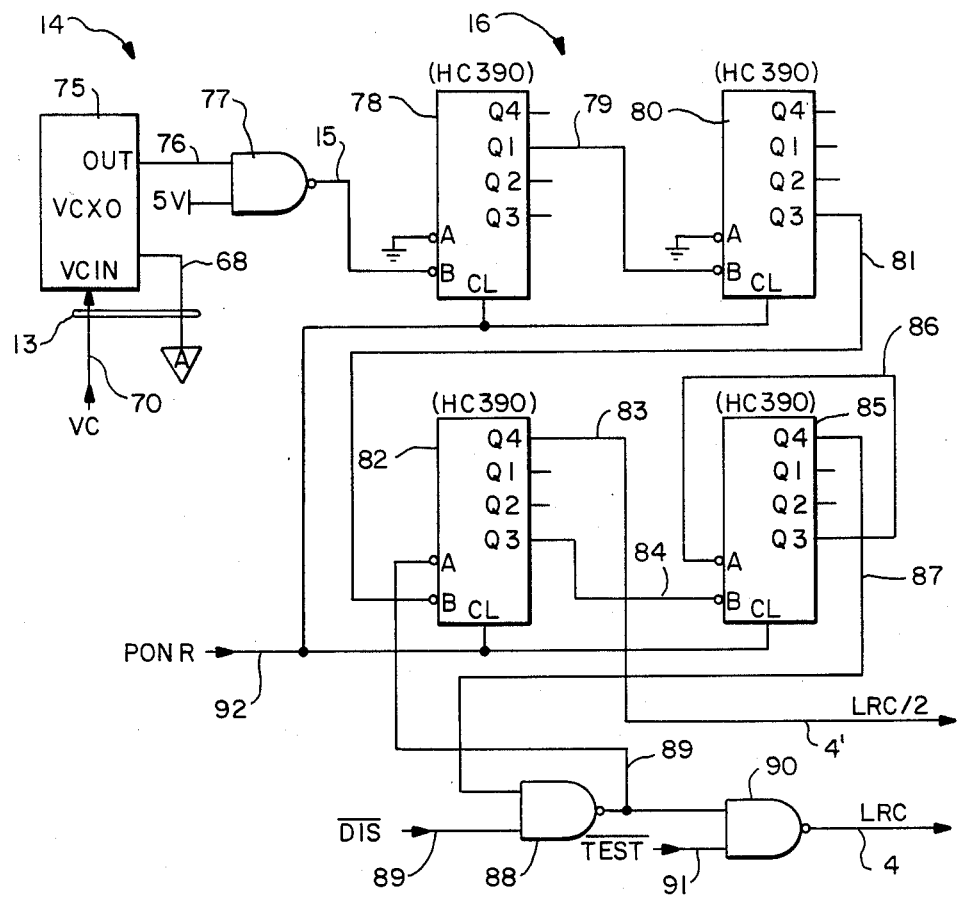
FIG. 3 is a schematic diagram of a voltage-controlled oscillator and frequency divider for use in the system of FIG. 1.

With reference to the figures, a detailed description of the present invention and of a preferred embodiment is provided. The description as set forth below, provides with reference to FIGS. 1, 7, 8 and 14, an overview of the inventive system. With reference to FIGS. 2 through 6, the details of the hardware implementation of the phase-locked loop shown in FIG. 1 are provided. With reference to FIGS. 9 through 13, the preferred implementation of the phase-error processor program is provided.

I. System Overview (FIG. 1, FIG. 7, FIG. 8, FIG. 14)

An intelligent phase-locked loop 1, implementing the present invention, is shown in FIG. 1. The system shown in FIG. 1 is an example of a system that could be used in a network synchronization module for a communication system such as described in the Fukinuki et al article cited above. The intelligent phase-locked loop 1 includes an 8-kHz reference input interface 2 which is connected to receive an external reference signal REF on line 3. In addition, the reference input interface 2 receives a loop reference signal on line 4. The reference input interface 2 selects either the external reference signal REF or the loop reference signal LRC for supply as an external reference signal ERC to the phase-locked loop on line 5. The reference input interface 2 is controlled by an input select signal ISL on line 6 generated by the phase error processor 9 as described below.

The external reference signal ERC on line 5 and the loop reference signal LRC on line 4' are supplied as inputs to a phase detector and fault detector circuit 7. The phase detector and fault detector circuit 7 generates a digital phase error and fault sample signal on line 8. The phase error and fault sample signal on line 8 is supplied to a phase error processor 9. The phase error processor 9 performs signal and fault processing to generate a frequency control signal on line 10. In addition, in response to the fault processor, the input select signal ISL on line 6 is generated. The phase error processor 9 also generates monitoring signals on line 11 for use in the network synchronization system. The operation of the monitoring signals is not important to the present invention. The phase error processor 9 also provides control signals to the phase detector and fault detector 7 across line 8.

The frequency control signal on line 10 is supplied to a digital-to-analog (D/A) converter 12 which supplies an analog control voltage on line 13. A voltage-controlled oscillator 14 receives the control voltage on line 13 and generates a loop reference frequency on line 15. The loop reference frequency is supplied to a divider 16, the output of which is the loop reference signal on line 4.

With the exception of the reference input interface 2, each of the elements of the intelligent phase-locked loop 1 of FIG. 1 is described in more detail with reference to the figures indicated in the respective blocks. The reference input interface 2 is a standard element that is not important to the operation of the present invention and is therefore not described in more detail.

In operation, the intelligent phase-locked loop 1 of FIG. 1 locks the loop reference signal on line 4 to frequency and phase alignment with the external reference signal on line 5. With the intelligent phase-locked loop 1, a high accuracy reference signal can be generated locally in a communication system for use in data extraction. In the preferred system, the communication network implements a T1 multiplexing scheme transmitting one frame every cycle of an 8 kHz reference. Thus, frame synchronization can be accomplished with the high stability loop reference signal generated by the intelligent phase-locked loop 1.

The phase error processor 9 performs digital signal processing as a way of implementing phase error signal filtering. The process of acquiring phase and frequency alignment in the phase-locked loop 1 includes an adaptive loop parameter selection algorithm shown in FIG. 7 and a fault-tolerant self-monitoring algorithm shown in FIG. 8.

Figure 7:
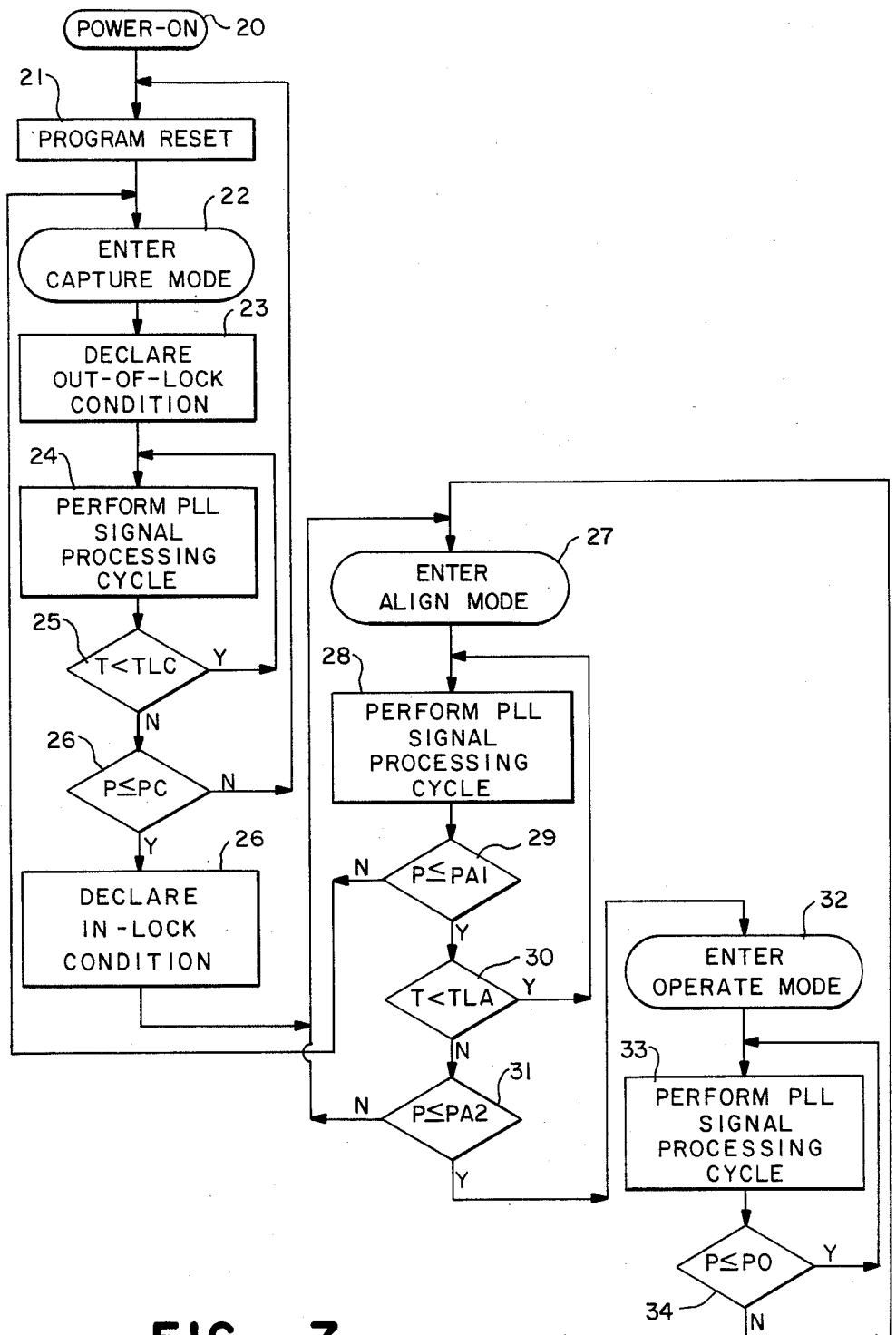
FIG. 7 is a flowchart providing an overview of the phase error processing algorithm of the present invention.

FIG. 7 illustrates the adaptive loop parameter selection algorithm. The algorithm includes a plurality of modes M, where M goes from 1 to m and m is at least 3; an initial mode (M equals 1), one or more intermediate modes (M is between 1 and m) and a final mode (M equals m). The initial mode provides the widest bandwidth operation and is adapted for quick acquisition of alignment of the loop reference signal with the external reference signal. The intermediate mode or modes provide progressively narrower bandwidths and provide for intermediate stabilization of the loop reference signal. The final mode provides the narrowest bandwidth, resulting in high accuracy and noise immunity suitable for use during normal, long term operation.

For the initial mode, in addition to setting the parameters of the transfer function to provide the desired bandwidth, two additional parameters are set. These parameters include a capture mode time-out limit TLC and an end-of-capture mode phase error limit PC. During the intermediate modes, the parameters of the transfer function are adapted to provide the appropriate bandwidth and three additional parameters are set. The three parameters include an align mode loss-of-lock phase error limit PA1 and end-of-align mode phase error limit PA2, and an align mode time-out limit TLA. In the final mode, in addition to setting the transfer function parameters to a bandwidth suitable for high accuracy operation, an operate mode loss-of-lock limit PO is set.

FIG. 7 shows a system including a single intermediate mode. The initial mode is designated the capture mode, the intermediate mode is designated the align mode and the final mode is designated the operate mode.

The algorithm of FIG. 7 begins with power on 20. After power on, a program reset algorithm is carried out (block 21). After program reset 21, the algorithm enters the capture mode (block 22). In the capture mode, the transfer function parameters are adapted to the broad bandwidth. During the capture mode, the phase error processor 9 declares an out-of-lock condition (block 23), to monitoring hardware.

After declaring the out-of-lock condition, the processor 9 performs the phase-locked loop signal processing cycle (block 24). At the end of the signal processing cycle, the algorithm determines whether the time-out limit TLC has been exceeded (block 25). If the parameter TLC has not been exceeded, then additional signal processing cycles are performed by a branch to block 24. If the parameter TLC has been reached or exceeded, then the phase error is tested to determine whether it is less than or equal to an end-of-mode phase error limit PC (block 26). If the phase error is not less than or equal to the end-of-mode limit PC, then a branch is taken to block 21 for program reset. If the phase error is less than the end-of-mode phase error limit PC, then the algorithm declares an in-lock condition (block 26) and enters the align mode (block 27).

Upon entering the align mode in block 27, the transfer function parameters are adapted to provide an intermediate bandwidth. Next, a phase-locked loop signal processing cycle is performed in block 28. At the end of the signal processing cycle from block 28, the phase error is tested to determine whether it is within an align mode loss-of-lock phase error limit PA1 (block 29). If it is not within the limit, a branch is taken to block 22 to enter the capture mode. If the phase error is within the loss-of-lock limit, the align mode timeout condition TLA is checked in block 30. Thus if the time T that the algorithm has been in the align mode is less than the parameter TLA, a branch is taken to block 28 for an additional signal processing cycle. If the time T is not less than the parameter TLA, the accumulated phase error is tested to determine whether it is less than or equal to the align mode end-of-mode limit PA2 (block 31). If the phase error is greater than the end-of-mode limit, the algorithm branches to block 27 to re-enter the align mode. If the phase error is less than or equal to the end-of-mode limit, then the algorithm proceeds to block 32 to enter the operate mode.

Upon entering the operate mode, the transfer function parameters are adapted to provide a narrow high accuracy bandwidth and the operate mode phase error limit parameter PO is set. After entering the operate mode, a signal processing cycle is performed (block 33) and the phase error is tested to determine whether it is less than or equal to the operate mode out-of-lock limit PO (block 34). If the phase error limit is less than or equal to the out-of-lock limit, a branch is taken to block 33 to perform a following signal processing cycle. If the phase error is not less than or equal to the operate mode out-of-lock limit PO, a branch is taken to block 27 to enter the align mode.

In this application, the testing of the phase error involves testing of a function of the accumulated phase error signals. This function can take on many equivalent embodiments; a partial list of such embodiments of the function includes testing the frequency control signal, testing a single phase error sample, testing the result of the filter output for a given sample or testing the summation of phase errors over a group of samples.

The algorithm described in FIG. 7 includes a single intermediate mode. For algorithms including more than one intermediate mode, n, for n equal to 0 through N−1, the parameters PC, PA1$_n$, PA2$_n$, and PO are set up so that the following relationship is maintained: (n goes from 0 to N−1 for N intermediate modes.)

$$PC < PA2_0 < PA2_1 < \ldots PA2_n \ldots < PA2_{N-1} < PO.$$
$$PA1_0 > PA1_1 > \ldots PA1_n > \ldots PA1_{N-1} > PO.$$

In the n-th align mode, the parameter, $PA1_n$, is greater than the parameter $PA2_n$. In addition, the time-out parameters TLC and $TLA_n$ for n=0 through N−1, maintain the following relationship:

$$TLC < TLA_0 < TLA_1 \ldots < TLA_n \ldots < TLA_{N-1}.$$

FIG. 14 provides an example of phase error and time limits for an adaptive phase-locked loop with two align modes, align-0 and align-1. As illustrated in FIG. 14, the capture mode operates the transfer function with the broadest phase-locked loop bandwidth. It has a timeout limit TLC of 20 minutes and an end-of-capture mode phase error limit of 4 degrees. The align-0 mode has an intermediate phase-locked loop bandwidth which is narrower than the bandwidth of the capture mode. It has a timeout limit $TLA_0$ of three hours and an end-of-mode phase error limit $PA2_0$ of 15 degrees. In addition, it has an out-of-lock phase error limit $PA1_0$ of 58 degrees. The align-1 mode has a narrower phase-locked loop bandwidth than the align-0 mode. The end-of-mode phase error limit $PA2_1$ of align-1 mode is 30 degrees and the out-of-lock phase error limit $PA1_1$ is 57 degrees. The timeout limit $TLA_1$ is 9 hours.

The operate mode has yet a narrower phase-locked loop bandwidth and an out-of-lock phase error limit PO of 56 degrees. There is no timeout parameter and there is no end-of-mode phase error limit for the operate mode.

As can be seen from a review of FIG. 7, the phase error processor provides a means for establishing hysteresis in the phase-locked loop. This is implemented by assigning two phase error limits to each intermediate mode. Switching to a narrower bandwidth mode takes place according to a forward relation, that is only when the phase error is below the end-of-mode limit PA2 at the end of the mode time limit. Switching to a wider bandwidth mode takes place when the phase error exceeds a loss-of-lock limit PA1.

The reverse relation of the algorithm of FIG. 7 shows a change from align mode to capture mode only as a result of the loss-of-lock parameter PA1 test in block 29. If the end-of-mode parameter PA2 test fails in block 31, then the algorithm stays in the align mode.

This is a simplified hysteresis implementation, showing a forward relation based on one parameter test and a reverse relation based on a different parameter test. The preferred implementation provides a variation of the reverse relation by causing a branch to the capture mode, if the end-of-mode parameter PA2 test fails—the equivalent of a branch from block 31 to block 22. (See FIG. 12C, block 1225.) This variation of hysteresis is found to provide for quicker alignment on average because of the faster response time and the shorter time-out limit of the capture mode.

Note that the end-of-mode phase error parameter increases for narrower bandwidth modes even though the narrower bandwidth modes provide higher accuracy of frequency and phase alignment. The increase of the end-of-mode limit PA2 for narrower bandwidth modes is needed because the external reference signal to the phase-locked loop exhibits phase jitter and wander (slow jitter). The narrower the bandwidth, the more the jitter is attenuated and the less the jitter is tracked by the loop reference signal of the phase-locked loop. This results in the possibility for a large instantaneous phase error at the phase-locked loop input, even though the alignment with the average external reference signal becomes more accurate.

Figure 8:
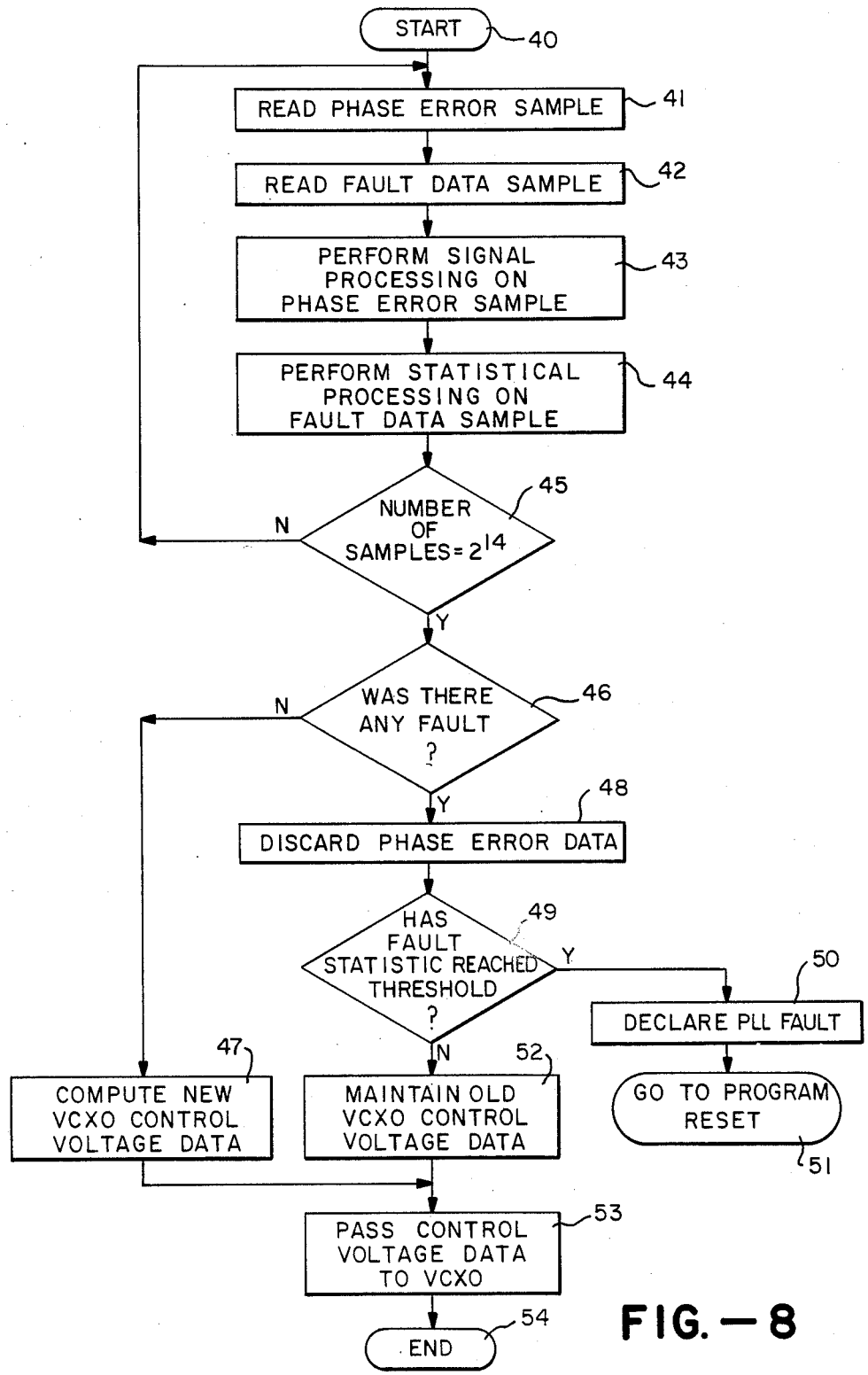
FIG. 8 is a flowchart providing an overview of the fault processing algorithm of the present invention.

FIG. 8 provides a flowchart of the fault tolerant self monitoring algorithm implemented in the phase error processor 9 of the present invention. With this algorithm, the fault processing is integrated with the phase error processing.

The fault processing algorithm is entered in block 40 designated START. After START, a phase error sample is read by the processor (block 41). Also, a fault data sample from the phase error and fault detector 7 is read by the processor (block 42). After reading the phase error sample and the fault data sample, the signal processing ie performed on the phase error sample (block 43). Next, statistical processing is performed on the fault data sample (block 44). This process is repeated for a signal processing interval of $2^{14}$ samples. Thus the next step involves testing the number of samples against the signal processing interval limit (block 45). If a signal processing interval has not been completed, a branch is taken to block 41. If the signal processing interval has been completed, the algorithm proceeds to block 46 where the fault data accumulated during the signal processing interval is tested to determine whether any fault occurred. If no fault occurred, a new control voltage for the voltage-controlled oscillator is computed (block 47). If there was a fault in the test of block 46, the phase error data accumulated during the signal processing interval is discarded (block 48). Next, the accumulated fault data is tested as a result of the statistical processing to determine whether a selected threshold has been reached (block 49). If the threshold has been reached, a phase-locked loop fault is declared (block 50) and a branch is taken into program reset (block 51).

If the fault statistic had not reached the threshold in the test of block 49, the control voltage data from a previous signal processing interval is maintained (block 52). Next, control voltage data generated in block 47 or maintained in block 52 is passed to the voltage-controlled oscillator (block 53). The end of this self-monitoring fault tolerant algorithm is reached (block 54).

As can be seen, according to the algorithm of FIG. 8, the phase error processor 9 of FIG. 1 provides a means for performing statistical processing on fault data and a means for storing frequency control voltages from previous processing intervals. According to the statistical processing of the fault data, the old frequency control voltage is used when a fault condition is detected. If no fault condition is detected, the new frequency control voltage is used. The processor algorithm is reset only when fault statistics indicating serious problems are accumulated. A detailed implementation of the statistical fault processing is described below.

II. Hardware Implementation (FIGS. 2–6)

FIG. 1 sets forth an overview block diagram of the hardware of an intelligent phase-locked loop 1 according to the present invention. Each of the blocks includes a reference to one of FIGS. 2 through 6 (with the exception of the reference input interface) in which the schematic of the corresponding block is provided. FIGS. 2 through 6 are schematic diagrams teaching the preferred implementation of the invention and do not include circuit details which are not necessary to this teaching. Reference can be made to user information for the chips used by one practicing the invention for such details.

FIG. 2 is a schematic of the D/A converter 12. The D/A converter 12 receives as inputs the signals on line 10 from the phase error processor 9. The signals on line 10 include bits 0 through 3 of the processor data bus PRD 60. In addition, the D/A chip select signal $\overline{DACS}$ is provided on line 61, the processor write signal $\overline{PRWR}$ is provided on line 62 and processor address bits PRA8 and PRA9 are provided on lines 63. The digital analog converter is implemented with a D/A converter chip 64 (AD7542). The chip 64 provides a conversion of a 12-bit digital signal to an analog ouput. The 12-bit digital signal is received in three cycles across four input lines D0 through D3 which are connected to line 60. The three cycles are controlled by the address input lines A0 and A1 which receive the processor address bits PRA8 and PRA9 on line 63. The chip is enabled by the chip select signal connected to receive line 61 and the write signal connected to line 62. In addition, a reference voltage is provided from a standard chip 65 (AD584) as a reference input to the D/A converter 64.

The outputs of the D/A converter include a first output on line 66 and a second output on line 67. In addition, an analog ground is provided on line 68. The first output is connected as a first input to an operational amplifier 69 implemented with a standard chip ADOP-07. The second output on line 67 and the analog ground on line 68 are connected together and through a resistor as the second input to the operational amplifier 69. The output of the operational amplifier 69 is a control voltage on line 70. The control voltage on line 70 in combination with the analog ground on line 68 is supplied as a voltage control signal on line 13. In addition, the voltage on line 70 is provided as a reference feedback input to the D/A converter 64.

In operation, the D/A converter converts the digital voltage control data from the phase error processor to analog control voltage signal VC that controls the frequency of the variable frequency oscillator 14. The 12-bit digital input is converted directly to a unipolar negative voltage in the range of 0 to −5 volts.

FIG. 3 is a schematic of the voltage-controlled oscillator which receives the input signals on line 13 and the frequency divider generating the loop reference signal on lines 4 and 4'. The inputs to the voltage controlled oscillator include analog signal VC and an analog ground from lines 70 and 68 respectively. The output of the voltage controlled oscillator 75 is a stable frequency reference signal on line 76. It is supplied as a first input to a NAND-date 77. The second input to the NAND-gate is a high voltage so that it operates as an inverter. The output of the inverter 77 is the frequency signal on line 15. The signal on line 15 is supplied to the frequency divider 16.

The frequency divider 16 consists of four 4-bit counters, implemented with standard chip HC390. The first counter 78 is connected with its A input to ground and its B input to line 15. The Q1 input of the counter 78 is connected across line 79 as the B input to the second counter 80. The A input of the counter 80 is connected to ground. The Q3 output of the counter 80 is connected across line 81 as the B input to counter 82. The A input to counter 82 is connected to the reference output described below. The Q4 output of the counter 82 is connected across line 83 as a reference signal equal to LRC/2 on line 4' which is used by the phase detector and fault detector 7 in FIGS. 4 and 5.

The Q3 output of the counter 82 is connected across line 84 as the B input to counter 85. The A input of counter 85 is connected across line 86 to the Q3 output of the counter 85. The Q4 output of the counter 85 is connected across line 87 as a first input to NAND-gate 88. A second input to NAND-gate 88 is a disable control signal $\overline{DIS}$ on line 89. When the disable control signal is low, the output is disabled. When it is high, the gate operates as an inverter. the output of NAND-gate 88 is connected across line 89 as the A input to the counter 82 and as a first input to AND-gate 90. The second input to AND-gate 90 is connected across line 91 to a test input which allows for supplying a test signal as a reference. The output of AND-gate 90 is the loop reference frequency signal on line 4. The power on reset signal PONR on line 92 is connected to the clear inputs of each of the counters 78, 80, 82 and 85 and is asserted during power on.

In operation, the voltage controlled oscillator provides a stable 5 MHz clock whose frequency and phase can be controlled by the control voltage VC. Gate 77 can be connected to disable the clock for test purposes if needed.

The divider 16 operates to divide the 5 MHz clock frequency down to an 8 kHz signal on line 4 and a 4 kHz signal on line 4'. The logic of the divider chain allows it to obtain a duty cycle of the 8 kHz clock very close to 50 percent (actually 312 divided by 625). The 4 KHz clock on line 4', LRC/2, has a 50 percent duty cycle. NAND-gate 88 and NAND-gate 90 provide for disabling the counter output for substituting an external clock for test purposes.

Figure 4:
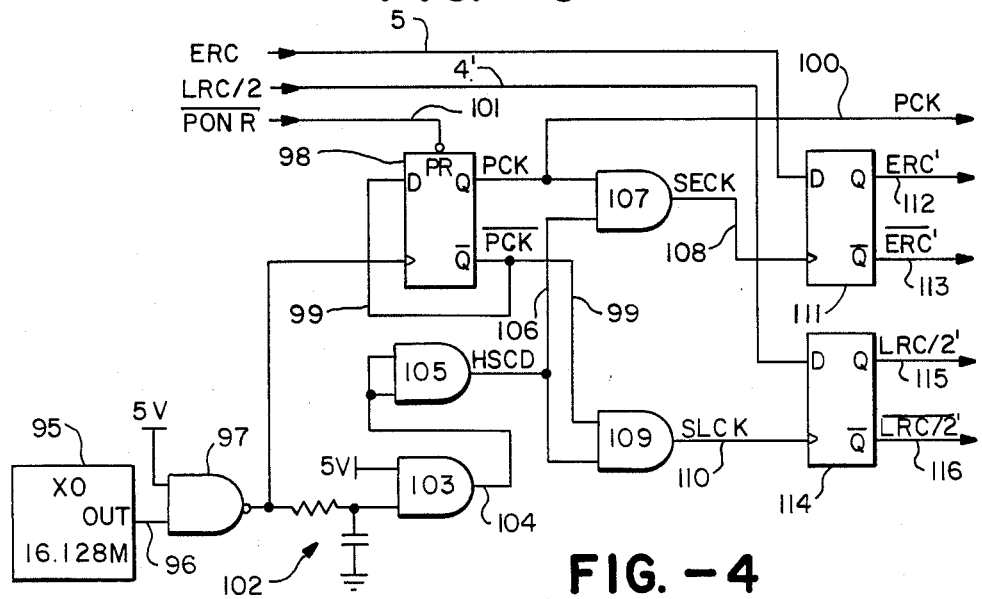
FIG. 4 is a schematic diagram of a signal sampling circuit for a phase detector and fault detector for use in the system of FIG. 1.
Figure 5:
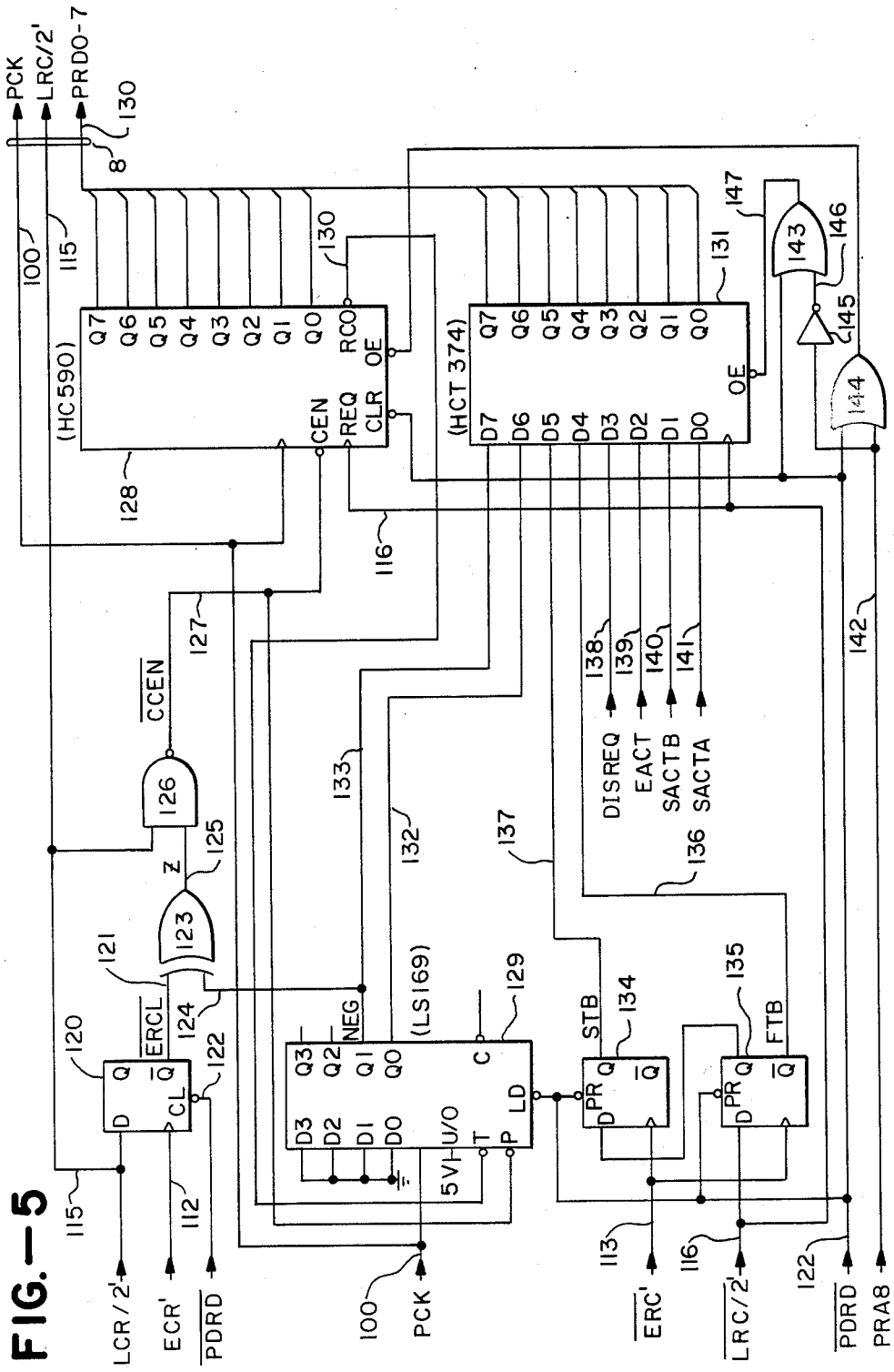
FIG. 5 is a schematic diagram of the second portion of the phase detector and fault detector producing the phase error signals and fault signals for use in the system of FIG. 1.

FIGS. 4 and 5 together make up the phase detector and fault detector 7 shown in FIG. 1. FIG. 4 is the signal sampling logic which receives the external reference signal ERC on line 5 and the loop reference signal LRC/2 on line 4'. In addition, a crystal oscillator 95 is included which provides a 16.128 MHz reference clock on line 96. The reference clock is supplied through the NAND-gate 97 to the clock input of a flip-flop 98. THe flip-flop 98 is connected to divide the clock signal by 2 with its $\overline{Q}$ output connected to its D input on line 99. The Q output of the flip-flop 98 is a phase detector clock PCK on line 100. The $\overline{Q}$ output of the flip-flop 98 is the inverse of the phase detector clock $\overline{PCK}$ on line 99. The preset input to the flip-flop is connected to line 101 through an active low power on reset signal $\overline{PONR}$. The power on reset signal $\overline{PONR}$ is generated during powerup.

In addition to being supplied as the clock input to the flip-flop 98, the output of the gate 97 is supplied through an RC delay circuit 102 as an input to AND-gate 103. A second input to AND-gate 103 is a high voltage causing the gate to operate as a signal driver. The output of the AND-gate 103 is connected to both inputs of a second AND-gate 105 across line 104. The output of the second AND-gate is the delayed output of the high speed clock HSCD on line 106.

The phase detector clock PCK on line 100 is connected as a first input to an AND-gate 107. The second input to AND-gate 107 is the high speed clock delayed signal HSCD on line 106. The output of the gate 107 is a set external reference clock pulse SECK on line 108. Likewise, the inverse of the phase detector clock $\overline{PCK}$ on line 106 is supplied as a first input to AND-gate 109. The second input to AND-gate 109 is the high speed clock signal delayed HSCD on line 106. THe gate 109 generates a set loop reference signal clock pulse SLCK on line 110.

The set external reference clock pulse SECK on line 108 is connected as a clock input to flip-flop 111. The data input to the flip-flop 111 is the external reference signal ERC on line 5. The Q output of the flip-flop 111 is the external reference signal retimes ERC' to the phase detector clock on line 112. The $\overline{Q}$ output is the inverse of the external reference signal retimed $\overline{ERC'}$ on line 113.

The set loop reference clock pulse SLCK on line 110 is connected as the clcok input to flip-flop 114. Flip-flop 114 receives as its data input the LRC/2 signal on line 4'. The Q output of the flip-flop 114 is the LRC/2 signal retimed sesignated LRC/2' on line 115. Likewise the $\overline{Q}$ output is the inverse of LRC/2 retimed with the phase detector clock and designated $\overline{LRC/2'}$ on line 116.

In operation, the signal sampling logic shown in FIG. 4 samples the phase detector input signals ERC and LRC/2 with the high-speed clock. As a result, the ERC and LRC/2 signals are retimed to the phase detector clock PCK preventing timing violations in the logic devices of the phase error measurement section shown in FIG. 5. Also, the signal sampling logic in FIG. 4 produces the phase detector clock PCK by dividing the high speed clock generated in the crystal oscillator 95 by 2.

FIG. 5 illustrates the phase error measurement logic in the phase detector and fault detector 7 of FIG. 1. The phase error measurement logic shown in FIG. 5 includes both phase detection logic and fault detection logic.

Phase detection logic receives the LRC/2' signal on line 115 as a D input to the flip-flop 120. The flip-flop 120 is clocked by the ERC' signal on line 112. The output of the flip-flop 120 is a signal designated $\overline{ERCL}$ on line 121. Flip-flop 120 is cleared by the processor data read signal $\overline{PDRD}$ across line 122. The $\overline{ERCL}$ signal on line 121 is supplied as a first input to an exclusive OR-gate 123. The second input of the exclusive OR-gate is a signal NEG on line 124 which indicates when the phase error is negative as described below. The output of the exclusive OR-gate 123 is a signal designated Z on line 125.

The signal Z on line 125 is supplied as a first iput to an NAND-gate 126. A second input to the NAND-gate is the LRC/2' signal on line 115. The output of the NAND-gate is the signal designated $\overline{CCEN}$ on line 127. The $\overline{CCEN}$ signal on line 127 is a counter enable signal which is supplied to an 8-bit counter 128 and a 4-bit counter 129 used to generate the phase error signal.

The 8-bit counter 128 and the 4-bit counter 129 are both clocked by the phase detector clock PCK on line 100. Thus, the counter 128 counts up during the assertion of the counter enable signal on line 127 and generates a cary out signal on line 130 upon overflow. The carry out signal on line 130 is supplied to the T input to the second counter 129 causing it to count the next clock cycle. Thus the two counters 128 and 129 are connected to provide a 10-bit phase error sample including one sign bit which is provided at the Q1 output of counter 129 as the NEG signal and nine magnitude bits. Q0–Q7 of counter 128 and Q0 of counter 129.

The clear input to the counter 128 and the load input to the counter 129 which results in a clear because its data inputs are grounded, are controlled by the active low processor data read signal $\overline{PDRD}$ on line 122.

The Q0 through Q7 outputs of the counter 128 are connected to the processor read bus, bits 0 through 7, PRD0-7, 130. The ninth bit and the sign bit from the Q0 and Q1 outputs of the counter 129 are connected as D6 and D7 inputs to a register 131 across lines 132 and 133 respectively. The other inputs to register 131 include the fault signals and other control signals.

The fault signals are generated with flip-flops 134 and 135. The flip-flop 135 receives the $\overline{LRC/2'}$ signal on line 116 at its data input and is clocked by the $\overline{ERC'}$ signal on line 113. Its Q output is connected as the data input to flip-flop 134 which is also clocked by the $\overline{ERC'}$ signal on line 113. Each of these flip-flops 135 and 134 are prset by the active low processor data read signal $\overline{PDRD}$ on line 122. The $\overline{Q}$ output of the flip-flop 135 is the fault signal FTB on line 136. The Q output of the flip-flop 134 is the fault signal STB on line 137. THe FTB is set high upon the first falling transition of ERC' occurring after a rising transition of LRC/2'. The signal STB on line 137 is normally high, but is set low upon a second falling transition of the ERC' between a rising transition of LRC/2' and the next falling transition.

The FTB signal on line 136 and the STB signal on line 137 are connected at the D4 and D5 inputs, respectively, into the register 131. The control signal DISREQ is connected across line 138 to the D3 input to the register 131. The control signals EACT on line 139, SACTB on line 140 and SACTA on line 141 are connected to the D2, D1 and D0 inputs respectively of the register 131. The register is clocked by the $\overline{LRC/2'}$ signal on line 116, the outputs Q0 through Q7 are connected to the processor data bus 130.

As can be seen, a phase and fault data sample is supplied in 8-bit words across a processor data bus 130. This is accomplished by the control of the output enable inputs to the counter 128 and the register 131. The output enable signals are asserted by a combination of the processor data read signal $\overline{PDRD}$ on line 122 and the processor address bit PRA8 on line 142. The $\overline{PDRD}$ signal on line 122 is connected as an input to OR-gate 143 and OR-gate 144. The PRA8 signal on line 142 is the second input to OR-gate 144 and is supplied to an inverter 145. The output of the inverter 145 on line 146 is the second input to the OR-gate 143. Thus when PRA8 is low during the assertion of the $\overline{PDRD}$ signal on line 122, the output of the OR-gate 144 is low, enabling the output of the counter 128. When the PRA8 bit is high, during the assertion of the $\overline{PDRD}$ signal on line 122, the output of the OR-gate 143 is low, enabling the output of the register 131. In this way, the two 8-bit bytes can be read in succession by toggling the PRA8 bit.

Thus, the phase error measurement logic shown in FIG. 5 measures the phase error between the rising edges of the ERC and LRC clocks. The measurement is performed by counting the pulses of the PCK clock between the rising edge of ERC' and the closest edge of LRC/2' during its high or measurement cycle. Depending on which edge of the LRC/2' (rising or falling) is closer to the rising edge of the ERC', the phase error is considered either positive or negative and the sign bit NEG is set accordingly. At the end of the measurement cycle, a 10-bit phase error signal consisting of 1 sign bit and 9 magnitude bits corresponding to a phase error in the range of plus or minus 180 degrees is latched. The phase error processor is then able to read the data during the LRC/2' low cycle.

Also, the phase error measurement logic in FIG. 5 checks the quality of the ERC signal by monitoring the number of its high to low transitions during the high cycle of the LRC/2' signal. Two transition bits, FTB and STB, are latched at the end of the measurement cycle and can be read by the phase error processor. The meaning of the transition bits FTB and STB is explained in the following Table 1.

TABLE 1

TRANSITION BITS CODE

| FTB (FIRST TRANSITION BIT) | STB (SECOND TRANSITION BIT) | MEANING (Diagnostic Information) |
|---|---|---|
| 0 | 1 | No transition detected (loss of External Reference or hardware failure). |
| 1 | 1 | Only one transition detected (External Reference OK, Phase Detector hardware OK). |
| 1 | 0 | More than one transition detected. (External Reference of bad quality or hardware failure). |
| 0 | 0 | Illegal State. (hardware failure). |

Further, input status bits are latched at the end of each measurement cycle, including DISREQ, EACT, SACTA and SACTB.

Figure 6:
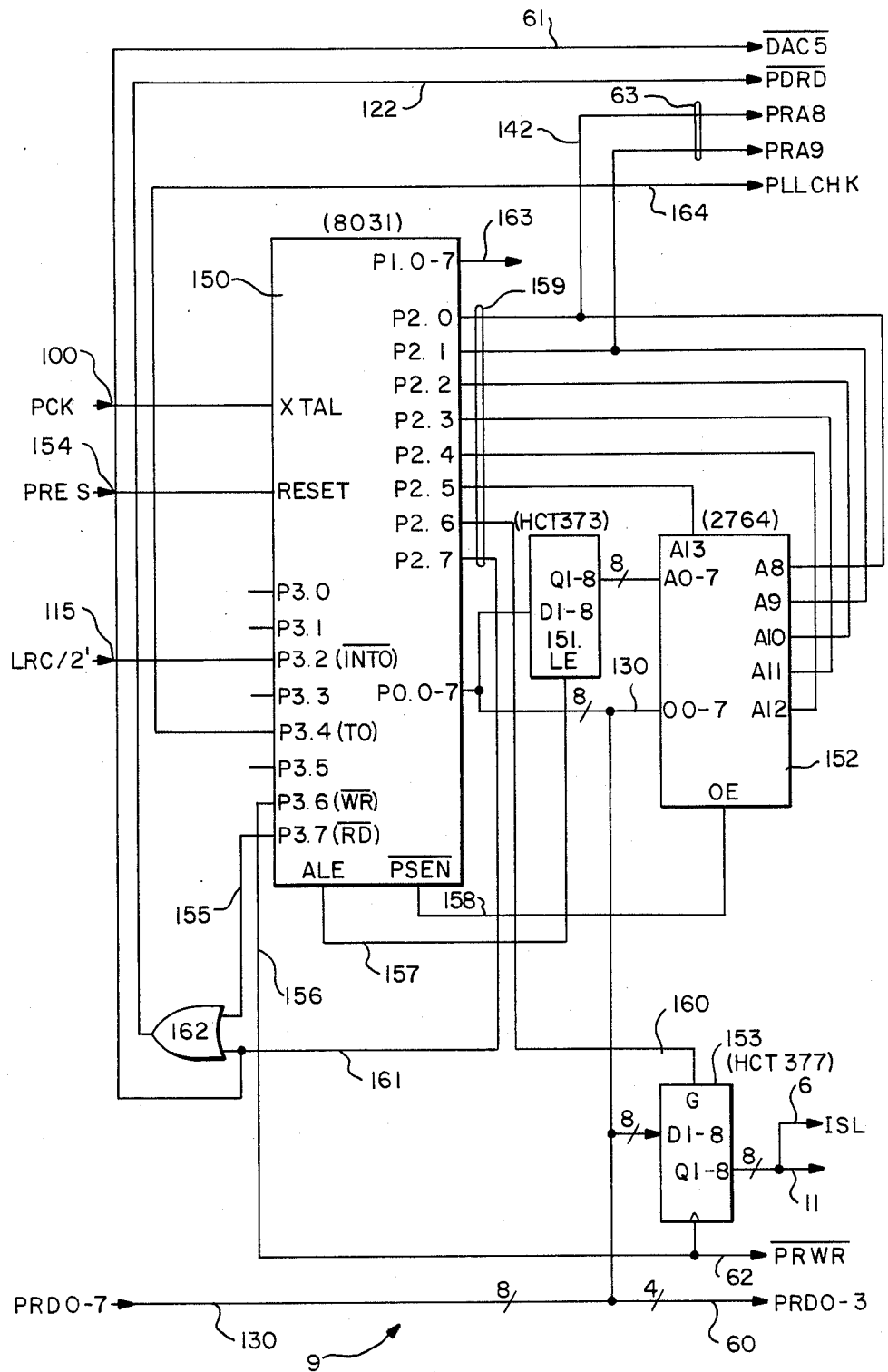
FIG. 6 is a schematic diagram of the phase error processor for use in the system of FIG. 1.

FIG. 6 shows a phase error processor 9 of FIG. 1. The phase error processor is implemented with an Intel 8031 8-bit microcomputer 150, an associated address latch 151 implemented with an HCT373 chip, and a 2764 EPROM 152. In addition, an output latch (HCT337) 53 is included.

The microcomputer 150 is checked by the phase error clock PCK on line 100. A processor reset signal on line 154 is supplied to reset the processor upon powerup. The LRC/2' signal on line 115 is supplied to the $\overline{INT0}$ active low input of the microcomputer 150. The processor generates an active low write signal $\overline{WR}$ online 156 and an active low read signal $\overline{RD}$ on line 155. Also, an address latch enable signal ALE on line 157 is connected to the latch enable input LE of the address latch 151. Further, a program store enable signal $\overline{PSEN}$ on line 158 is supplied to the output enable input OE of the EPROM 152. The processor data bus 130 is connected to the P0.0-7 inputs of the microcomputer 150, to the D1-D8 inputs to the address latch 151, and to the outputs O0-O7 of the EPROM 152. Further, the processor data bus 130 is connected to the output latch 153 and supplies its 4 least significant bits across line 160 to the D/A converter as described in FIG. 2.

The microcomputer 150 generates high order address bits A8-A15 from its P2.0-P2.7 outputs 159. The address bits A8-A13 are connected directly to the EPROM inputs A8-A13. THe address bit A14 is connected across line 160 to enable the output latch 153. The address bit A15 is connected across line 161 as a second input to OR-gate 162. The first input to the OR-gate 162 is the read signal on line 155. The output of the OR-gate 162 is the processor data read signal active low $\overline{PDRD}$ on line 122. Further, the address bit A15 is connected to line 61 as the D/A chip select signal $\overline{DACS}$.

The $\overline{WR}$ signal on line 156 is used to clock the output latch 153 and to provide and processor write signal active low $\overline{PRWR}$ on line 62. The output of the latch 153 includes the input select signal on line 6 and monitoring signals on lines 11 as shown in FIG. 1.

The address bits A8 and A9 PRA8 and PRA9, respectively, are also connected across line 63 to the D/A converter shown in FIG. 2 and on line 142 to control the addressing of the counter and output register of the phase error measurement logic shown in FIG. 4.

The microcomputer 150 addresses the counter 128 of FIG. 5 by asserting address bit A15 on line 161 and A8 on line 142. THe least significant bit of the phase error signal is supplied on the processor read bus, line 0, PRD0. The phase detector most significant byte is read by the processor by asserting address bit A15 low and address bit A8 high which results in reading the outputs of the register 131 shown in FIG. 5. This results in loading of the sign bit, the most significant bit of the magnitude of the phase error, the STB and FTB fault signals and the input status word including DISREQ, EACT, SACTB and SACTA. The input status word is used by the phase error processor to select appropriate input for the phase-locked loop and/or to enter the appropriate mode of operation. The opeation of this input status word is not important to the present invention except as it applies to the network synchronization implementation. The operation of these bits is described with reference to FIG. 11B. The processor bus P1.0-P1.7 on line 163 is available for testing and handshaking with external devices.

The processor writes the four least significant bits across line 60 to the D/A converter upon asserting address bit A15 low, A14 high, A9 low and A8 low. Upon asserting address bits A15 low and A14 high, and A9 low and A8 high, the second most significant 4-bit section of the digital frequency control signal is supplied to the D/A converter. Upon asserting address bit A15 low and A14 high and address bits A9 high and A8 low, the four most significant bits of the digital frequency reference signal are supplied to the D/A converter. The D/A converter is laoded upon asserting address bit A15 low, A14 high and address bits A9 and A8 high.

The process write data to the output latch 153 by asserting address bits A15 high and A14 low which results in loading the input select signal on lines 6 and the monitoring signals on line 11.

The processor also asserts a PLL check bit on line 164 at its output pin P3.4. Thi bit is toggled by the software periodically as set forth in the following algorithm description. IF the PLL check bit is not toggled, external hardware is able to detect that the phase-locked loop is not working properly.

The microcomputer 150 is initialized during the processor reset routine described with reference to FIG. 13. This routine is entered by the processor after receiving a hardware reset signal PRES on line 154 or under software control in situations defined in the algorithm described with reference to FIGS. 9-12.

Most of the functions of the software are performed in real time, i.e., between two consecutive interrupt pulses. The phase detector interrupt routine described with reference to FIG. 10 describes each of those real time functions. The processor starts executing this phase detector interrupt routine in response to the interrupt pulse from the phase detector and must finish its execution before the next interrupt pulse, i.e., within 250 microseconds. The interrupt pulse as mentioned above is supplied by the falling edge of the LRC/2' signal on line 115. Since the processor clock frequency is 8.064 MHz, this interval allows 168 processor machine cycles per interrupt period.

III. Program Implementation (FIGS. 9-13)

Figure 9:
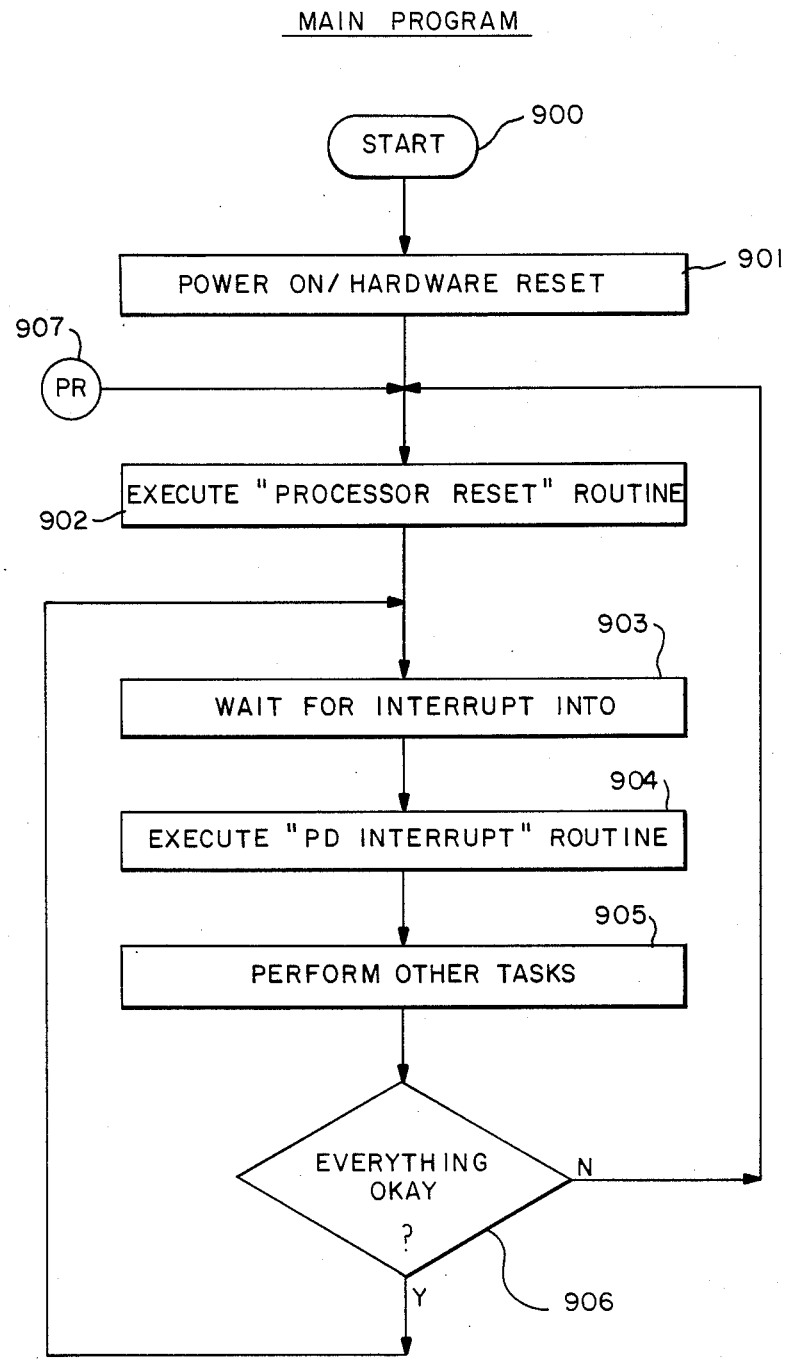
FIG. 9 is a flowchart illustrating an overview of the algorithm implemented in the preferred embodiment.

FIGS. 9-13 provide a detailed flowchart of the algorithm implemented in the preferred embodiment. FIG. 9 provides a main program overview. FIGS. 10A-10E provide a phase detector interrupt routine which constitutes the main body of the signal processing algorithm. FIGS. 11A-11D provide a phase-locked loop control routine which is entered during the phase detector interrupt routine. FIGS. 12A-12D provide a phase-locked loop status routine which is likewise entered from the interrupt routine. Finally, FIG. 13 provides the processor reset routine.

The flowchart of the main program in FIG. 9 begins with the START symbol (block 900). The algorithm starts at power on or hardware reset (block 901). Next, a processor reset routine is executed (block 902). The processor reset routine is set forth in detail in FIG. 13. After processor reset, the microcomputer waits for the phase detector interrupt INT0 (block 903). Upon receiving the phase detector interrupt, the phase detector interrupt routine described with reference to FIG. 10, is executed (block 904). The phase detector interrupt routine accomplishes its tasks during the time between two consecutive falling edges of the LRC/2′ signal as discussed above. Accordingly, it is effectively a real time processing routine.

After the phase detector interrupt routine, the microcomputer is free to perform other tasks while awaiting the next interrupt (block 905), Next, the microcomputer is monitored to determine that it is functioning properly (block 9060. If it is not functioning properly, a branch is taken to block 902 to execute the processor reset routine. If it is functioning properly, a branch is taken to block 903 to await the next phase detector interrupt.

The main program shown in FIG. 9 shows a processor reset entry point 907 which is entered from various points in the algorithm described with reference to FIGS. 10-12.

The algorithms in FIGS. 10-12 use abbreviations set forth in the following Table 2.

TABLE 2

| ABBR. | DEFINITIONS OF ALGORITHM ABBREVIATIONS |
|---|---|
| | DEFINITIONS |
| PR: | Entry to processor reset routine |
| RQLD: | Request for loading D/A |
| PM: | Most significant byte of phase detector |
| PL: | Least significant byte of phase detector |
| PE: | Phase error sample |
| ISW: | Input status word |
| NM: | Number of current phase error measurement |
| PDSC: | Phase detector failure string count |
| PDFC: | Phase detector failure count |
| PER: | Current sum of phase error |
| HO: | Entry to hold-over mode |
| IP: | Entry to interpolation routine |
| PPR: | Contents of proportional register |
| SA: | Proportional scaling constant |
| PIR: | Contents of integral register |
| SB: | Integral scaling constant |
| VC: | Correction word |
| VF: | Frequency control word |
| VB: | VCXO bias (here: VB=$2^{11}$) |
| VFF: | Fractional part of VF |
| VFI: | Integer part of VF |
| VFIP: | VF interpolated |
| VFC2-VFC4: | Interpolation correction values |
| LD: | Entry to D/A registers load routine |
| IE: | Entry to the end of interrupt routine |
| VFIPL, VFIPM, VFIPH: | 4-bit nibbles of VFIP to load to D/A registers |
| ISL0, ISL1: | Input selector control bits |
| PMD4, PMD5: | Bits D4 and D5 of PM |
| PETL: | Low limit of the test phase error magnitude |
| OC: | Entry to "old configuration" |
| ISW: | Input status word (4 bits) |
| PISW: | Previous input status word |
| ISF: | Input selector failure bit |
| DISRQ,SACTA,SACTB,EACT: | Input status word control bits |
| TRC,ERCA,ERCB,ERCC: | Selectable reference signals |
| PISF: | Previous ISF |
| LDS: | Entry to "load status" |
| TL: | Capture or align mode duration time limit parameter |
| T1: | Time measured by Timer T1 |
| PEL: | Phase error limit parameter |
| AL: | Entry to ALIGN MODE |
| SAA,SBA,PELA,TLA (SA,SB,PEL,TL): | Loop parameters for ALIGN MODE |
| LCF: | Lock failure bit |
| CLM: | Entry to "close to limit" routine |
| CAP: | Entry to CAPTURE MODE |
| SAC,SBC,PELC,TLC (SA,SB,PEL,TL): | Loop parameters for CAPTURE MODE |
| PEAO: | Phase error limit for ALIGN to OPERATE mode switching |

TABLE 2-continued
DEFINITIONS OF ALGORITHM ABBREVIATIONS

| ABBR. | DEFINITIONS |
|---|---|
| SAO,SBO,PELO (SA,SB,PEL): | Loop parameters for OPERATE MODE |
| VC: | Correction word |
| VL: | Limit for VC (here: VL=1843) |

The phase detector interrupt routine starts in FIG. 10, block 1000. The first step is to set the PLLCHK signal to zero and to assert the signal (block 1001). This signal is monitored by external hardware to determine whether the phase detector is working properly. Next, a software parameter RQLD is tested to determine whether it is set. When it is set, a request is made to load the D/A converter (blocks 1002 and 1003). When the RQLD signal is not asserted, a branch is taken around block 1003 to block 1004 where the RQLD is set to zero. This results in the loading of a frequency control signal to the D/A converter at the beginning of each signal processing interval with a frequency control signal that was generated during a previous signal processing interval.

The next step involves reading the data from the phase detector and fault detector in the form of the most significant byte of data PM from the register output and the least significant byte of data PL from the counter register output (block 1005). Next, the phase error signal PE, which is comprised of a 10-bit code from the two bytes of data read from the phase detector and fault detector, is extracted and the input status word is extracted from the most significant byte (block 1006). Next, the phase-locked loop control algorithm is executed as set forth in FIG. 11 (block 1007). Next, the number of the current phase error measurement NM within a given signal processing interval, is tested to determine whether it is the first measurement (block 1008). If it is the first measurement, the phase-locked loop status routine set forth in FIG. 12 is executed (block 1008). Otherwise a branch is taken around the phase-locked loop status routine to block 1009 which begins in FIG. 10B.

A parameter PER which is equal to the sum of the phase error measurements within a signal processing interval, is then updated by the extracted phase error value PE (block 1009).

The next step, the number of current measurement tested to determine whether it is the last measurement in the interval, one interval including $2^{14}$ measurements in the embodiment described (block 1010). If it is not the last measurement, a branch is taken to the interpolation routine (block 1011) which is entered in FIG. 10D described below. For the purposes of the discussion at this point, the interpolation routine results in incrementing the value NM, setting the value PLLCHK to 1 and asserting the value and ending of the interrupt routine.

If the last sample of the signal processing interval has been taken as indicated by the tests in block 1010, a phase detector failure string count parameter PDSC is tested (block 1012), as part of the fault processing. If the string count exceeds 8, a branch is taken to the processor reset routine in block 1013. If the string count does not exceed 8 in this last sample of a signal processing interval, the string count is reset to zero and a second parameter in the fault tolerant algorithm, the phase detector failure count PDFC, is set to zero (block 1014).

The next block, the filter transfer function parameter PPR which is the contents of a proportional register, is set equal to the value PER divided by the mode parameter SA; also the filter transfer function value PIR, which is equal to the contents of an integral register maintained by the microcomputer, is set equal to the old PIR plus PPR divided by the mode parameter SB (block 1015). This implements a proportional plus integral, or PPI, filter equation for the phase-locked loop having a bandwidth that is adaptable by changing the parameters SA and SB.

Next, the absolute value of the parameter PIR is tested to determine whether it is exceeds $2^{11}$ (block 1016). This corresponds to the maximum value of control voltage that cn be transmitted to the D/A converter. If the contents of the integral register PIR does not exceed the limit, then the correction word VC is set to PIR+PPR (block 1017). If the value does exceed the limit, the value PIR is set to the limit and the correction word is set to PIR (block 1018).

Next, the sum of phase error measurements PER is reset to zero and the number of the sample NM is set to zero (block 1019). The frequency control word is set to the value of the voltage-controlled oscillator bias VB minus the correction word (block 1020). Here the bias VB is equal to $2^{11}$.

Next, the frequency control word is tested to determine whether it is negative in block 1021. If it is negative, the frequency control word is set back to zero (block 1022). If it is not negative in block 1021 or after block 1022, the program branches to block 1023 in FIG. 10C.

In block 1023, the frequency control word is tested to determine whether it is greater than the maximum value allowable. The maximum value is equal to $2^{12}-1$ for the embodiment described. However, the test includes a 1-bit safety margin so the test is made against a $2^{12}-2$ limit. If the value is greater than the limit, the frequency control word is set to the limit (block 1023). Otherwise, a branch is taken to block 1024 where variable VFL is set to the two most significant bits of the fractional part VFF of the frequency control voltage. The variable VFM is set to the 12 least significant bits of the integer part of the frequency control word and the variable VFLE is set to the third most significant bit of the fractional part of the frequency control word. After setting VFL, VFM and VFLE, the algorithm tests whether VFLE is equal to one (block 1025). If VFLE is not equal to one, the frequency control word interopolated VFIP is set equal to VFM in block 1026. If VFLE is equal to one in the test of block 1025, the value VFIP is set equal to VFM plus one in block 1027. Next, the parameter VFL is tested to dtermine whether it is equal to zero in block 1028. If it is equal to zero, the interpolation variables VFC2, VFC3 and VFC4 are set to zero in block 1029 and a branch is taken to the load routine from block 1030. The load routine is entered in FIG. 10E as discussed below.

If the value VFL is not equal to zero, the algorithm tests whether VFL is equal to one in block 1031. IF the value is equal to one, the interpolation parameters VFC2 and VRC3 are set equal to zero and the parameter VFC4 is set equal to one (block 1032). From block 1032, the load routine is entered in block 1033. If the parameter VFL is not equal to one in block 1031, a branch is taken to block 1034 at the top of FIG. 10D. In block 1034, the parameter VFL is tested to determine whether it is equal to two. If it is equal to two, the interpolation parameters VFC2 and VFC4 are set to one and the parameter VFC3 is set to zero in block 1035 and a branch is taken to the load routine from block 1036. If the parameter VFL2 is not equal to two, it must be equal to three and the interpolation parameters VFC2, VFC3 and VFC4 are all set to one in block 1037 and a branch is taken to the load routine from block 1038.

Beginning with block 1025 in the processor interrupt routine, interpolation parameters are set as mentioned above and an interpolation routine is used. These steps can be skipped if desired by taking a branch directly to the load routine shown in FIG. 10E.

In the preferred embodiment, the interpolation routine is implemented. It is entered during a signal processing interval for all phase error samples except the last phase error sample as a result of the test in block 1010 and through entry point 1011 shown in FIG. 10B. In FIG. 10D, the interpolation routine IP is begun with block 1039 after a branch from block 1011. In this step, the number of the measurement sample is incremented in block 1040. Next, the number of the measurement sample is tested to determine whether it is equal to the number 2,048 which corresponds to one-eighth of the total number of samples taken in a single signal processing interval (block 1041). For the sample numbered 2,048, the frequency control word interpolated VFIP is set to VFM in block 1042 and a branch is taken to the load routine in block 1043. This results in negating the interpolation of block 1027 after one-eighth of the signal processing interval. If the sample in block 1041 is not equal to the tested number, a branch is taken to block 1044 where NM is tested against 4,096 which corresponds to one-quarter of the samples in a single signal processing interval. If sample 4,096 has been detected, the frequency control word interpolated is then set to VFM plus the variable VFC2 in block 1045 and a branch is taken to the load routine from block 1046. If sample 4,096 is not detected, a branch is taken to block 1047 at the top of FIG. 10E.

In block 1047, the sample number N/M is tested for 8,192. If sample 8,192 is detected, the frequency control word interpolated is set to VFM plus VFC3 in block 1048 and a branch is taken to the load routine from block 1049. If sample 8,192 is not detected in block 1047, a branch is taken to block 1050. In block 1050, the sample number is tested for 12,288. If sample 12,288 is not detected, a branch is taken to the end of the interrupt routine from block 1051. The end of interrupt routine IE is entered in block 1057 below.

If the number of sample 12,288 is detected, then the frequency control word interpolated is set to VFM plus VFC 4 in block 1052. Next, the load routine is entered as indicated by block 1053.

The first step in the load routine is to set the variables VFIPL, VFIPM and VFIPH to the 4 least significant bits of VFIP, 4 middle bits of VFIP and 4 most significant bits of VFIP, respectively, in block 1054. Next, the values VFIPL, VRIPM and VFIPH are loaded in sequence to the registers in the D/A converter (block 1055). Finally, the value RQLD is set to 1 in block 1056 in preparation for loading in block 1003 during the next flow of the interrupt routine. Next, the end of the interrupt routine is entered as indicated in block 1057. At the end of interrupt routine, the test signal PLLCHK is set to 1 and asserted in block 1058 and the algorithm ends in block 1059.

In addition, due to the relatively long signal processing interval of $2^{14}$ samples, an interpolation routine is implemented that increments the frequency control word by 1 for $\frac{1}{8}$, $\frac{1}{4}$, $\frac{1}{2}$, or $\frac{3}{4}$ of the cycles during the signal processing interval. This results in an increase of the average value of the frequency control signal proportional to the fractional part of the result of the proportional plus integral signal processing. As a result, an effective resolution of the D/A converter is increased beyond its 12-bit limit.

Figure 10A:
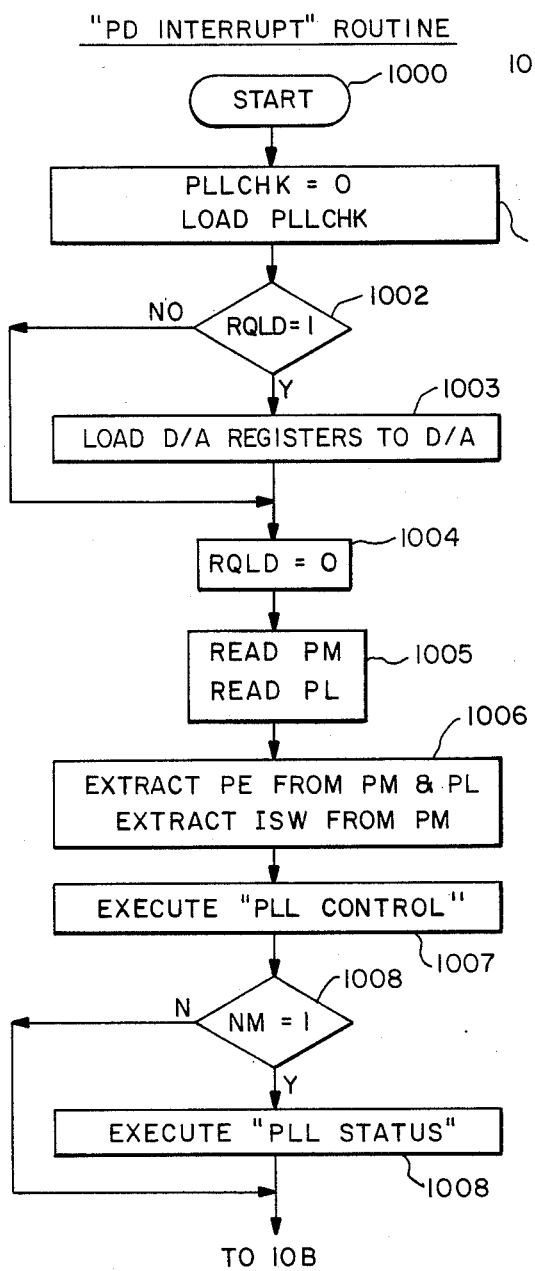
Figure 10B:
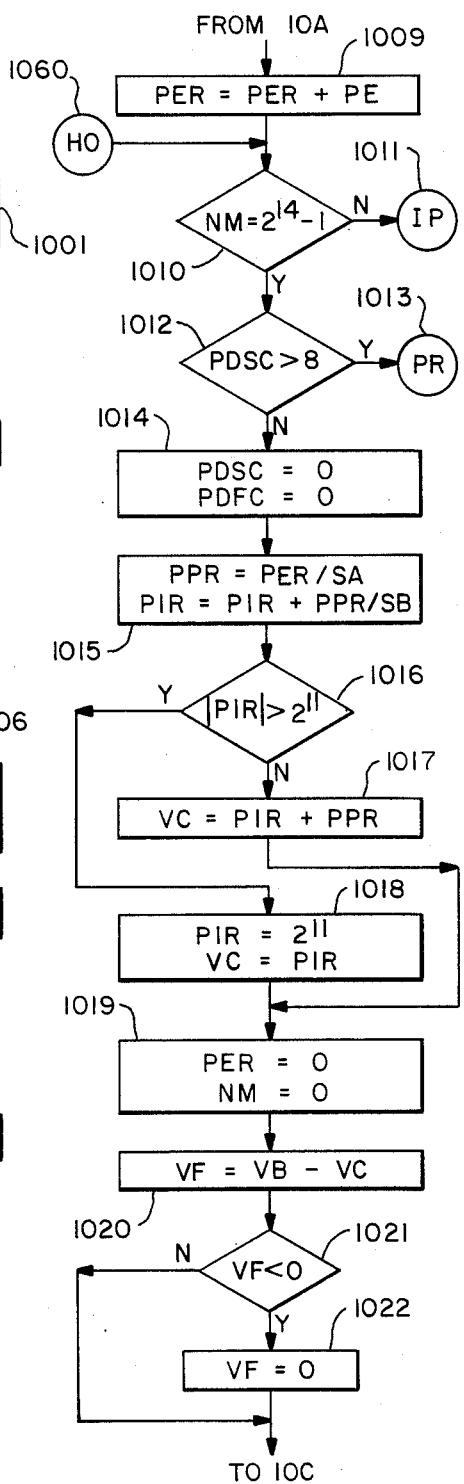

The phase detector interrupt routine also includes the holdover entry point designated by block 1060 in FIG. 10B which is entered from the phase-locked loop control algorithm executed during block 1007 described in detail with reference to FIG. 11. The entry into the holdover routine in block 1060 results in discarding the current phase error sample and in holding over the value of the frequency control word from the previous sample.

FIG. 11 illustrates the phase-locked loop control routine entered at START block 1100. The control routine is executed for every phase error sample prior to executing the transfer function of the phase detector interrupt routine. The first step of the routine involves testing the input select signal ISL0 and ISL1 in block 1101. The selector bits are set in block 1108 for each sample. If the selector bits do not indicate a problem in the selection of the external reference, then a branch is taken to block 1106 at the top of FIG. 11B. If a problem is indicated by the selection of the test reference signal TRC, the algorithm proceeds to block 1102. In block 1102, bits 4 and 5 of PM which correspond to the signals FTB and STB, generated by the phase and fault detector, are tested. If they are both equal to 1, then no problem is detected with the phase detector input and the algorithm proceeds to block 1103 where the magnitude of the phase error sample is tested against the test loop phase error limit PETL in block 1103. If the magnitude of the phase sample is greater than the phase error limit, it is tested in block 1104 to determine whether it is negative. If the phase error sample is both greater in magnitude than the phase error limit for the test loop and negative, then no problem is detected and a branch is taken to block 1106. If the phase error sample fails either of the tests in block 1103 or block 1104, the algorithm proceeds to block 1105 where the phase detector string count is incremented.

In block 1106, the input status word ISW is tested to determine whether it is equal to the previous input status word. If they are the same, then a branch is taken to the old configuration entry point shown in FIG. 11C from block 1107. If they are not the same, then the parameters ISL0, ISL1 and ISF are set according to the table of block 1108.

The preferred embodiment of the present invention provides the possibility of selecting four possible external reference signals shown as TRC, ERCA, ERCB and ERCC. FIG. 1 illustrates only two possible selections, LRC and the reference signal. The selection of the various external reference signals is not important to the invention except that by providing a plurality of reference signals, a more reliable system can be implemented. In particular, in the standard network synchronization system will include a plurality of phase-locked loops generating a reference signals and interconnected by the input interface to provide redundancy. The input status word as shown in block 1108 is used to determine the selection of the external reference.

After setting ISL0, ISL1 and ISF, the values of ISL0 and ISL1 are loaded in block 1109 to the input interface.

Next, in block 1110, the present input selector failure bit ISF and previous input selector failure bit PISF are tested to determine whether they are both equal to 1. If they are both equal to 1, the processor reset routine is entered in block 1111. If they are not both equal to 1, the PISF variable is set equal to the current ISF in block 1112 at the top of FIG. 11C. Thus, two consecutive error signals in the input selector must be asserted before a processor reset will occur in block 1111. Again, the input selector failure bit is not described in the detailed description of the hardware as it is not important to the phase error processing of the present invention.

Next, in block 1113, the previous input status word and the current input status word are tested to determine whether the disable request bit DISRQ is changed from 1 to 0. If it has changed from 1 to 0, then the processor reset routine is entered from block 1114. If it has not changed, the current sum of the phase error measurements is set to 0 and the previous input status word register in the microcomputer is set equal to the current input status word in block 1115. After block 1115, the holdover routine is entered from block 1116.

The old configuration routine is entered at block 1117 from block 1107. In the old configuration routine, the previous input selector failure bit is tested to determine whether it is equal to 1 in block 1118. If it is equal to 1, the processor reset routine is entered in block 1119. If it is not equal to 1, the input selector bits are tested to determine whether they are both 0 in block 1120. If they are both 0, then an out of lock condition is asserted in block 1121 and the holdover routine is entered from block 1122. If the test in block 1120 did not find both input selector bits equal 0, the algorithm proceeds to block 1123 at the top of FIG. 11D.

In block 1123, the fault signals FTB and STB are tested to determine whether they are both equal to 1. If they are both equal to 1, no error is detected and the phase detector failure count PDFC is set equal to 0 in block 1124 and the algorithm ends in block 1129. If both fault bits are not 1, the phase detector failure count is incremented in block 1125. In block 1126, the failure count is tested against the threshold 10. If it has not reached the threshold, the algorithm branches to block 1129 to end. If the threshold has been reached, the phase detector failure count PDFC is set to 0, the sum of phase error measurements PER is set to 0 and the phase detector string count PDSC is incremented in block 1127. After block 1127, the holdover mode is entered from block 1128.

The phase-locked loop control routine consists of phase-locked loop self-testing which occurs when the ISL0 and ISL1 bits are both 0. During the self-test branch of the algorithm, no noise or glitches are expected, so the failure string count value as tested in block 1105 is given much greater weight than errors detected during normal processing. Thus, the phase error detector string count is incremented for each problem detected during self-testing.

In addition, the control routine results in reconfiguring the input selector if the input status words change. Again, the normal path involves no change in the input status word. If the input status words have changed, a testing of the input selector is implemented as well and the enable signal implemented by the DISRQ bit is detected.

In the normal mode, the fault bits FTB and STB are tested. If no problem is detected, the control routine ends. If a problem is detected, a failure count is maintained up to 10 consecutive failures. When 10 consecutive failures are detected in a signal processing interval, the accumulated phase error sample PER is discarded but the phase error routine continues. The phase detector string count is updated by the control routine and tested in the phase detector interrupt routine in block 1012. The string count must exceed 8 for a signal processing interval before the phase detector routine is interrupted by a processor reset.

During the first sample period of a signal processing interval, the phase-locked loop status routine is entered from block 1008 after the phase-locked loop control routine. The phase-locked loop status routine is provided in FIGS. 12A-12D. The phase-locked loop status routine implements the multiple mode operation of the transfer function for the phase error processing.

The routine starts at block 1200 in FIG. 12A. First, the algorithm is tested to determine whether it is in the capture mode in block 1201. If it is in the capture mode, a capture mode time limit is tested in block 1202. The time limit is determined by a timer T1 in the microcomputer and a parameter TL is established by the status routine. If the time limit has not expired, a branch is taken to the load status routine from block 1203 which is entered at the end of the phase-locked loop status routine.

If the time limit has expired, the contents of the proportional register is tested to determine whether its absolute value is greater than a phase error limit parameter PEL in block 1204. If the parameter exceeds the limit, a processor reset is entered from block 1205. If it does not exceed the limit, the out of lock parameter is set to 1; which, because it is active low, indicates an in lock condition (block 1206). This string of the routine from 1202 to 1206 operates to test at the end of the capture mode limit whether the phase error is within range allowed for shift to the align mode. If it is, the algorithm is declared in lock and enters the align mode at block 1207. Upon entering the align mode, the transfer function parameters SA, SB, PEL, TL and LCF are set to the align mode values. Further, the timer T1 is reset and started. After setting the align mode parameters, entry is made to the close to limit routine in block 1209 which is entered at the top of FIG. 12D.

If the test in block 1201 detected that the algorithm was not in capture mode, the algorithm branches to block 1210 where the absolute value of the contents of the proportional register is again tested against the parameter PEL. This parameter PEL is set to a loss of lock limit for the align or operate modes. In the capture mode, the parameter PEL is the end of mode limit.

The relationship of the software modifiable loop parameters implemented by the phase-locked status loop routine is set forth in the following Table 3.

TABLE 3

| SOFTWARE MODIFIABLE LOOP PARAMETERS | | | | |
|---|---|---|---|---|
| | OPERATE MODE | ALIGN MODE | CAPTURE MODE | HOLD-OVER MODE |
| SA | $2^{17}$ | $2^{14}$ | $2^{10}$ | N/A* |
| SB | $2^{14}$ | $2^9$ | $2^4$ | N/A |
| PEL | 10 (56°) | 165 (58°) | 182 (4°) | N/A |
| PEAO | N/A | 42 | N/A | N/A |
| TL | N/A | 180 minutes | 20 minutes | N/A |
| PETL | N/A | N/A | N/A | 142 |

*N/A - not applicable

If the absolute value of the proportional register exceeds the limit, the algorithm tests whether the LCF bit is set to 1 in block 1211. If the LCF bit is set to 1, a test is made as to whether the algorithm is in the align mode in block 1212. If it is not in the align mode, then by default it is in the operate mode and a branch is made to the align mode entry point from block 1213. Otherwise, entry into the capture mode is made as indicated at block 1214.

Entry into the capture mode involves setting the out of lock bit to zero and the close to limit bit to 1, both bits being active low in block 1215. Next, in block 1216, the capture mode parameters are set and the timer T1 is reset and started. Then, entry to the load status routine is made from block 1217.

If the contents of the proportional register exceed the limit as tested in block 1210, a branch is taken to block 1219 where the LCF bit is set to 0 and the out of lock bit is set to 1 indicating an in lock condition. If the test of the LCF bit in block 1211 indicated that it was not equal to 1, a branch is taken to block 1218 where the LCF bit is set to 1.

The algorithm proceeds from block 1218 or 1219 to block 1220 at the top of FIG. 12C where a test is again made to determine whether the algorithm is in the align mode. If it is not in the align mode, a branch is taken to the close to limit routine from block 1221. If it is in the align mode, the align mode time limit is tested in block 1222. If the time limit is not exceeded, the close to limit routine is entered from block 1223. If it is exceeded, the contents of the proportional register are tested against the parameter PEAO which provides the end of align mode phase error limit (block 1224). If the end of align mode phase error limit is exceeded, entry is made to the capture routine from block 1225. If the phase error limit is not exceeded, the algorithm enters the operate mode in block 1226.

In block 1226, the operate mode parameters are set. The close to limit routine is then entered from block 1227.

FIG. 12D beings with the entry point of the close to limit routine in block 1228. Upon entry to the close to limit routine, the absolute value of the control word VC is tested against a limit in block 1229. If the limit is exceeded, the close to limit signal is set to 0 for an active low signal in block 1230. If the limit is not exceeded, the close to limit value is set to 1, the load status routine results in loading the out of lock bit and the close to limit bit in block 1233 and end of the phase-locked loop status routine in block 1234.

The status routine described with reference to FIGS. 12A through 12D basically implements that described with reference to FIG. 7. However, the LCF bit implements an additional level of fault tolerance by requiring two consecutive measurement cycles that exceed the out-of-lock phase error limit to do a mode fallback.

Finally, FIG. 13 sets forth the processor reset routine which is entered through various points during the flow of the algorithm. The processor reset routine begins at the START block 1300. The processor reset entry point is indicated in block 1301. After the processor reset entry point, the interrupt INT0 is inhibited in block 1302 so that the phase detector interrupt routine is disabled. Next, the frequency control word interpolated VFIP is set to the bias parameter VB, the D/A registers are loaded with the value of VFIP and the conversion is carried out in block 1303. Next, the program parameters are set out in block 1304 are set to the initial values used. After setting the parameters to the initial values, the capture mode is entered in block 1305 where the capture mode transfer function parameters are set and the timer T1 is reset. Next, the input select, out-of-lock and close-to-limit signals are asserted in block 1306. After assertion of the status signals in block 1306, a wait period of 800 microseconds is entered in block 1307. After the 800 microsecond wait, the interrupt INT0 is enabled in block 1308. The processor reset routine ends in block 1309. On the next assertion of the interrupt signal, INT0, the phase detector interrupt routine is begun.

The 800 microsecond delay implemented in the processor reset routine interrupts the toggling of the PLLCHK signal by the processor interrupt routine. This marks a processor reset for hardware monitoring the operation.

CONCLUSION

The present invention provides for a phase-locked loop system capable of handling complex network synchronization requirements better than any known prior art. The invention is particularly suited for implementation on T1 multiplexed communication channels requiring tight synchronization.

The algorithm taught by the invention is used on high stability analog phase-locked loops with a digital processor employed for signal processing and control functions. The phase-locked loop is designed to achieve and maintain extremely accurate phase and frequency alignment with an external reference signal in the presence of jitter or interruptions in the external reference channel. According to the invention, the phase-locked loop achieves very accurate alignment quickly and fully automatically. Further, fault tolerances integrated into the phase error filtering routine improves immunity to system noise and recovery from failures.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in the art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. In a phase locked loop apparatus having a variable frequency oscillator responsive to a control signal for generating a loop reference signal, a phase detector receiving an external reference signal and the loop reference signal and generating phase error signals, and a phase error processor receiving the phase error signals and generating the control signal according to a transfer function having modes 1 to m, where m is at least 3, and where mode M, for M equal to 1, is adapted for quick alignment of the loop reference signal with the external reference signal, mode M for M between 1 and m, is adapted for stabilization of the loop reference signal, and mode M for M equal to m, is adapted for normal operation of the phase locked loop, a method for processing the phase error signals to generate the control signal, comprising for mode M the steps of:

(1) accumulating phase error signals for a preselected signal processing interval;
(2) generating the control signal according to the transfer function over the phase error signals accumulated during the signal processing interval;
(3) if M is greater than 1, testing the accumulated phase error signals against a loss-of-lock phase error limit for the mode M, and if the loss-of-lock phase error limit is exceeded, then shifting to mode M−1; and
(4) if M is less than m, repeating steps 1, 2, and 3 for a mode time limit for the mode M, and then, proceeding to step 5, or
if M=m, repeating steps 1, 2, and 3;
(5) testing the accumulated phase error signals to determine whether an end-of-mode phase error limit for the mode M is exceeded, and
if the end-of-mode phase error limit is not exceeded, then shifting to mode M+1.

2. The method of claim 1, further including the step after the step of testing the end-of-mode phase error limit of:
if the end-of-mode phase error limit is exceeded, and if M is between 1 and m, shifting to mode M−1.

3. The method of claim 1, further including the step after the step of testing the end-of-mode phase error limit of:
if the end-of-mode phase error limit is exceeded, and if M is between 1 and m, remaining in the mode M.

4. The method of claim 1, further including, after the step of testing the end-of-mode phase error limit, the step of:
if the end-of-mode phase error limit is exceeded, and if M equals 1, remaining in mode M.

5. The method of claim 1, wherein the phase detector further includes means for detecting faults in the external reference signal and generates fault signals and the processor includes means for storing the frequency control signal generated during a previous signal processing interval, and further including the steps of:
(1) accumulating fault signals generated during a current signal processing interval;
(2) performing statistical analysis of the accumulated fault signals during signal processing interval; and
(3) in response to the analysis of the accumulated fault signals, transferring the frequency control signal generated during the current signal processing interval or the frequency control signal generated during a previous signal processing interval to the variable frequency oscillator.

6. The method of claim 1, further including the step of interpolating the control signal during signal processing intervals.

7. A phase-locked loop apparatus comprising a variable frequency oscillator responsive to the control signal for generating a loop reference signal, a phase detector receiving an external reference signal and the loop reference signal and generating phase error signals, and a phase error processor receiving the phase error signals and generating a control signal according to a transfer function having modes 1 to m, where m is at least 3, and where mode M, for M equal to 1, is adapted for quick alignment of the loop reference signal with the external reference signal, mode M for M between 1 and m, is adapted for stabilization of the loop reference signal, and mode M for M equal to m, is adapted for normal operation of the phase locked loop, and wherein an improvement comprises:
means, in the phase error processor, for changing mode M to mode M+1 according to a forward relation and for changing mode M to mode M−1 according to a reverse relation, the forward and reverse relations establishing hysteresis.

8. A phase-locked loop apparatus comprising a variable frequency oscillator responsive to the control signal for generating a loop reference signal, a phase detector receiving an external reference signal and the loop reference signal and generating phase error signals, and a phase error processor receiving the phase error signals and generating a control signal according to a transfer function having modes 1 to m, where m is at least 3, and where mode M, for M equal to 1, is adapted for quick alignment of the loop reference signal with the external reference signal, mode M for M between 1 and m, is adapted for stabilization of the loop reference signal, and mode M for M equal to m, is adapted for normal operation of the phase locked loop, and wherein the processor comprises:
means for changing mode M to mode M+1 according to a forward relation based on a first set of parameters; and
means for changing mode M to mode M−1 according to a reverse relation based on a second set of parameters.

9. The apparatus of claim 8, wherein the first set of parameters and the second set of parameters are not identical sets.

10. The apparatus of claim 8, wherein the first set of parameters comprises a mode duration time limit and an end-of-mode phase error limit for mode M, where M is less than m.

11. The apparatus of claim 8, wherein the second set of parameters comprises a loss-of-lock phase error limit for mode M, where M is greater than 1.

12. The apparatus of claim 11, wherein the second set of parameters further includes the end-of-mode phase error limit and mode duration time limit for mode M, where M is between 1 and m.

13. The apparatus of claim 8, wherein the phase detector further includes means for detecting faults in the external reference signal and generates fault signals and the processor further includes:
means for storing the control signal generated during a previous signal processing interval;
means for accumulating fault signals generated during a current signal processing interval;
means for performing statistical analysis of the accumulated fault signals during current signal processing interval; and
means, responsive to the analysis of the accumulated fault signals, for transferring the frequency control signal generated during the current signal processing interval or the frequency control signal generated during a previous signal processing interval to the variable frequency oscillator.

14. The apparatus of claim 8, wherein the processor implements the reverse relation for mode M, where M is greater than 1, by testing the phase error signals against a loss-of-lock phase error limit for the mode M, and if the loss-of-lock phase error limit is exceeded, then shifting to mode M−1; and wherein the processor implements the forward relation for mode M, where M is less than m, by testing at a mode time limit for mode M the phase error signals to determine whether an end-of-mode phase error limit for mode M is exceeded, and if the end-of-mode phase error limit is not exceeded, then shifting to mode M+1.

15. The apparatus of claim 14, wherein the processor further implements the reverse relation for mode M, where M is between 1 and m, by testing at the mode time limit for mode M the phase error signals to determine whether the end-of-mode phase error limit for mode M is exceeded, and if the end-of-mode phase error limit is exceeded, then shifting to mode M−1.

16. A phase-locked loop apparatus comprising a variable frequency oscillator responsive to the control signal for generating a loop reference signal, a phase detector receiving an external reference signal and the loop reference signal and generating phase error signals, and a phase error processor receiving the phase error signals and generating a control signal according to a transfer function having modes 1 to m, where m is at least 3, and where mode M, for M equal to 1, is adapted for quick alignment of the loop reference signal with the external reference signal, mode M for M between 1 and m, is adapted for stabilization of the loop reference signal, and mode M for M equal to m, is adapted for normal operation of the phase locked loop, and wherein the processor comprises:

means, for mode M, where M is greater than 1, for testing the phase error signals against a loss-of-lock phase error limit for mode M, and if the loss-of-lock phase error limit is exceeded, then shifting to mode M−1;

means, for mode M, where M is less than m, for testing at a mode time limit for mode M the phase error signals to determine whether an end-of-mode phase error limit for mode M is exceeded, and if the end-of-mode phase error limit is not exceeded, then shifting to mode M+1; and means, for mode M, where M is between 1 and m, for testing at the mode time limit for mode M the phase error signals to determine whether the end-of-mode phase error limit for mode M is exceeded, and if the end-of-mode phase error limit is exceeded, then shifting to mode M−1.

17. The apparatus of claim 16, wherein the phase detector further includes means for detecting faults in the external reference signal and generates fault signals and the processor further includes:

means for storing the control signal generated during a previous signal processing interval;

means for accumulating fault signals generated during a current signal processing interval;

means for performing statistical analysis of the accumulated fault signals during current signal processing interval; and means, responsive to the analysis of the accumulated fault signals, for transferring the frequency control signal generated during the current signal processing interval or the frequency control signal generated during a previous signal processing interval to the variable frequency oscillator.

* * * * *

UNITED STATES PATENT AND TRADEMARK OFFICE
CERTIFICATE OF CORRECTION

PATENT NO. : 4,752,748
DATED : June 21, 1988
INVENTOR(S) : Miroslaw Grzeszykowski It is certified that error appears in the above-identified patent and that said Letters Patent is hereby corrected as shown below:

Column 8, line 18: "..processing ie.." should be "..processing is"
Column 9, line 53: "NAND-date 77" should be "NAND-gate 77"
Column 9, line 61: "Q1 input of" should be "Q1 output of"

Column 10, line 42: "THe flip-flop" should be "The flip-flop"
Column 11, line 1: "THe gate 109" should be "The gate 109"
Column 11, line 16: "retimed sesignated" should be "retimed designated"
Column 11, line 57: "cary out" should be "carry out"
Column 11, line 46: "i put to a" should be "input to a"
Column 11, line 64: "..bits. Q0-Q7.." should be "..bits, Q0-Q7.."
Column 12, line 14: "are prset by" should be "are preset by"
Column 12, line 17: "flip-flop 134-" should be "flip-flop 134"
Column12, line 17: "THe FTB" should be "The FTB"
Column13, line 36: "is checked by" should be "is clocked by"
Column 13, line 42: "online 156" should be "on line 156"
Column 14, line 10: "THe least" should be "The least"
Column 14, line 22: "The opeation" should be "The operation"
Column 14, line 39: "laoded upon" should be "loaded upon"
Column 14, line 42: "process write data" should be "processor writes"
Column 16, line 11: "properly(block 9060. If.." should be "properly (block 906.) If.."

UNITED STATES PATENT AND TRADEMARK OFFICE
CERTIFICATE OF CORRECTION

PATENT NO. : 4,752,748
DATED : June 21, 1988
INVENTOR(S) : Miroslaw Grzeszykowski It is certified that error appears in the above-identified patent and that said Letters Patent is hereby corrected as shown below:

Column 17, line 13: "w hether the" should be "whether the"
Column 18, line 61: "to dtermine" should be "to determine"
Column 18, line 68: "IF the value" should be "If the value"
Column 19, line 61: "VFC 4 in" should be "VFC4 in"
Column 23, line 9:  IN Table 3, under "Align Mode" Column:
                "PEAO....42.." should be "PEAO...42.."
                                                          (15°)

Column 24, line 57-58: "in the art" should be "in this art"

Signed and Sealed this

Eleventh Day of April, 1989

Attest:

DONALD J. QUIGG

*Attesting Officer*          *Commissioner of Patents and Trademarks*